United States Patent
Mittal et al.

(10) Patent No.: US 9,893,714 B2
(45) Date of Patent: Feb. 13, 2018

(54) CONFIGURABLE FIR FILTER WITH SEGMENTED CELLS

(71) Applicant: FREESCALE SEMICONDUCTOR, INC., Austin, TX (US)

(72) Inventors: Akshat Mittal, Greater Noida (IN); Arvind Kaushik, Ghaziabad (IN); Peter Z. Rashev, Calgary (CA); Amrit P. Singh, Ludiana (IN)

(73) Assignee: NXP USA, INC., Austin, TX (US)

( * ) Notice: Subject to any disclaimer, the term of this patent is extended or adjusted under 35 U.S.C. 154(b) by 386 days.

(21) Appl. No.: 14/841,712

(22) Filed: Sep. 1, 2015

(65) Prior Publication Data

US 2017/0063346 A1 Mar. 2, 2017

(51) Int. Cl.
  G05D 16/00 (2006.01)
  H03H 17/06 (2006.01)
  H03H 17/02 (2006.01)

(52) U.S. Cl.
  CPC ........ *H03H 17/06* (2013.01); *H03H 17/0225* (2013.01); *H03H 17/0294* (2013.01)

(58) Field of Classification Search
  CPC . H03H 17/06; H03H 17/0225; H03H 17/0294
  USPC ........................................................ 700/301
  See application file for complete search history.

(56) References Cited

U.S. PATENT DOCUMENTS

| | | | |
|---|---|---|---|
| 4,785,411 A | 11/1988 | Thompson et al. | |
| 5,995,542 A | 11/1999 | Goeckler | |
| 7,277,479 B2 | 10/2007 | Chiueh | |
| 7,480,603 B1 * | 1/2009 | San | G06F 17/5045 703/13 |
| 7,492,848 B2 | 2/2009 | Gurrapu | |
| 7,814,137 B1 | 10/2010 | Mauer | |
| 7,949,699 B1 * | 5/2011 | Neoh | H03H 17/0223 708/313 |
| 8,135,340 B2 | 3/2012 | Rofougaran | |
| 8,208,527 B2 | 6/2012 | Wang | |
| 8,589,461 B1 * | 11/2013 | D'Souza | H03H 17/0664 708/300 |
| 2006/0083297 A1 | 4/2006 | Yan | |

* cited by examiner

*Primary Examiner* — Robert Cassity
(74) *Attorney, Agent, or Firm* — Charles E. Bergere

(57) ABSTRACT

A FIR filter includes segment cells, each of which is configurable as an interpolation filter, a decimation filter, a symmetric filter, or an asymmetric filter. Two or more of the segment cells are configurable to be cascaded to form an interpolation filter, a decimation filter, a symmetric filter, an asymmetric filter, a complex symmetric filter, or a complex asymmetric filter. The FIR filter includes registers corresponding to the segment cells for storing coefficient values of the corresponding segment cells. The FIR filter further includes control circuits corresponding to the segment cells for generating control signals.

17 Claims, 14 Drawing Sheets

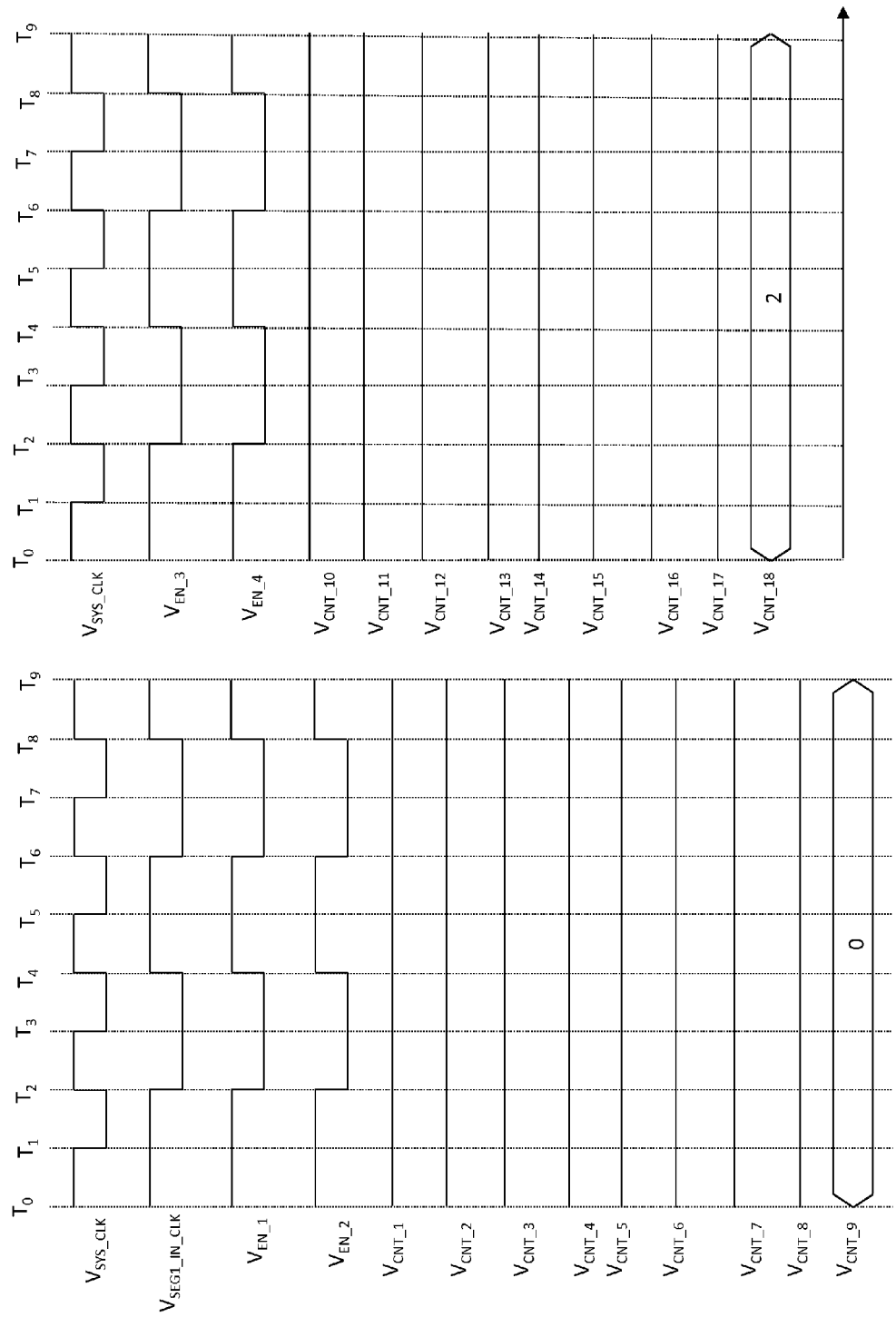

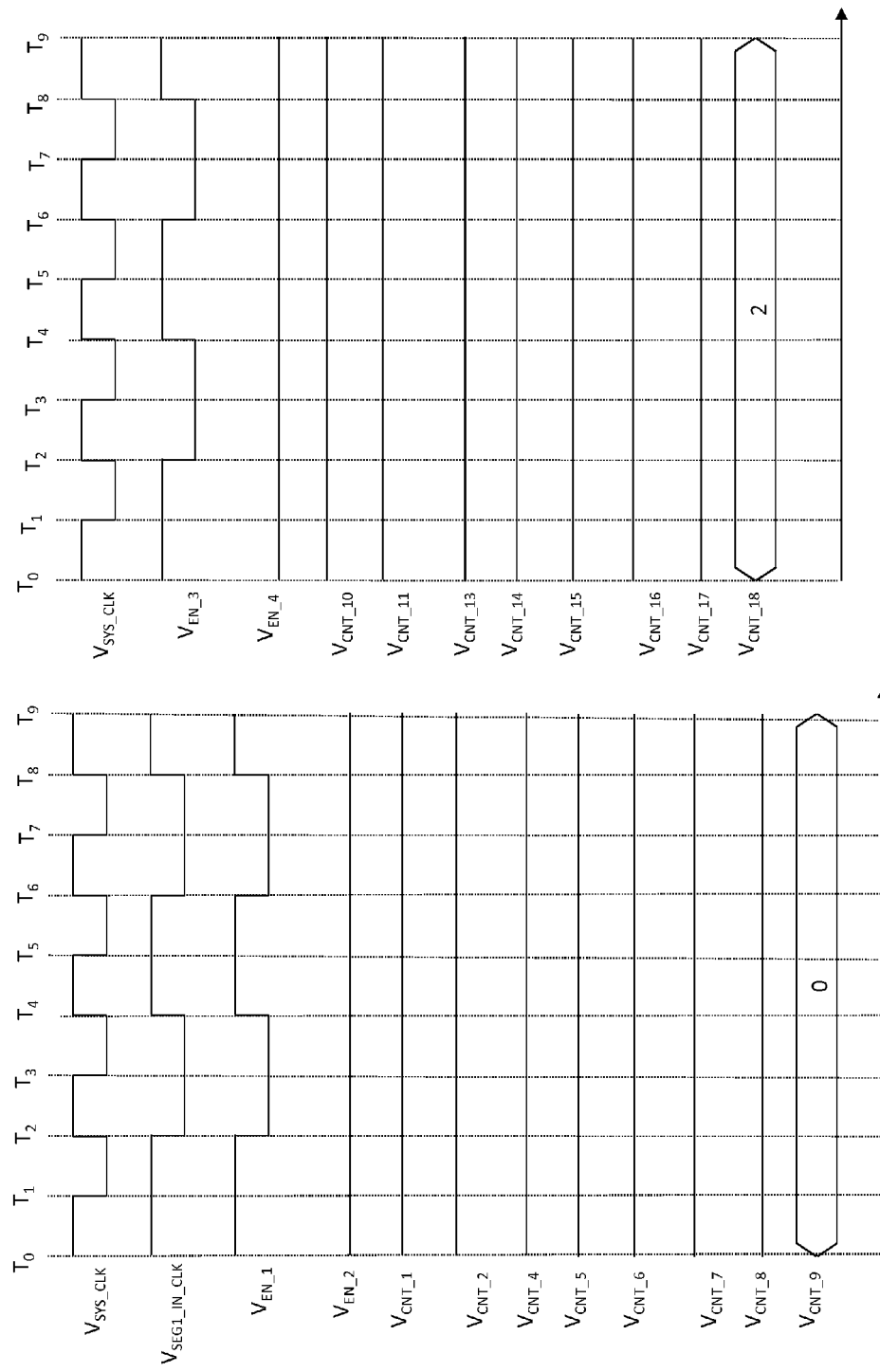

CONFIGURABLE FIR FILTER WITH SEGMENTED CELLS

BACKGROUND

The present invention generally relates to integrated circuits, and, more particularly, to a finite impulse response filter.

Finite impulse response (FIR) filters are commonly used in digital signal processing applications such as image processing, audio processing, and video processing applications. FIR filters include decimation filters, interpolation filters, symmetric filters, and asymmetric filters. Decimation and interpolation filters change a sampling rate of input samples and hence, are multi-rate filters. Symmetric and asymmetric filters perform filtering without changing the sampling rate of the input samples and hence, are single-rate filters.

A decimation filter removes M−1 samples out of every M samples of an input signal, thereby down-sampling the input signal by a factor of M. An interpolation filter inserts L−1 samples between adjacent samples of an input signal, thereby up-sampling the input signal by a factor of L. In order to reduce the hardware required for interpolation and decimation, polyphase filters are used for achieving interpolation and decimation. A conventional interpolation filter cannot be used as decimation filter and a conventional decimation filter cannot be used as an interpolation filter. This leads to an increase in circuit area and power dissipation.

Techniques for overcoming the aforementioned problem involve configuring a programmable logic device (PLD) as an FIR filter. The PLD can be operated in either interpolation or decimation mode as required. However, this technique does not support run-time configurability for changing the number of filter taps. The technique also does not support use of polyphase filters, so still there is additional circuit area and power consumption. The technique also does not support cascading of two or more FIR filters and hence, cannot achieve quadrature error compensation.

It would be advantageous to have a FIR filter that supports run-time configurability, yet does not consume unnecessary power and area, and supports quadrature error compensation.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIGS. 13A and 13B are a timing diagram illustrating the control signals when the cascaded unit is configured as a complex symmetric filter in accordance with an embodiment of the present invention; and FIGS. 14A and 14B are a timing diagram illustrating the control signals when the cascaded unit is configured as a complex asymmetric filter in accordance with an embodiment of the present invention.

DETAILED DESCRIPTION

Figure 1:
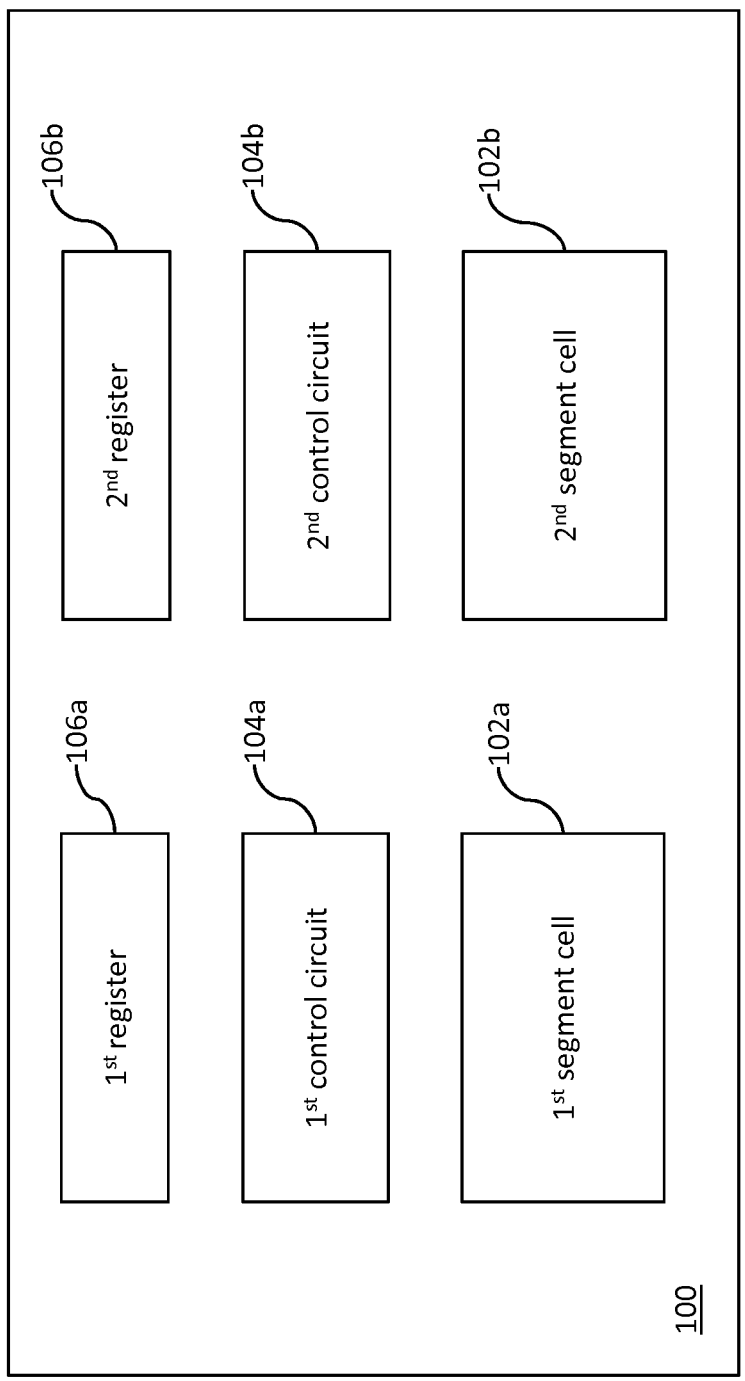
FIG. 1 is a schematic block diagram of a FIR filter circuit that includes first and second segment cells in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In an embodiment of the present invention, a finite impulse response (FIR) filter circuit is provided. The FIR filter circuit includes a plurality of segment cells. Each segment cell of the plurality of segment cells is configurable as at least one of an interpolation filter, a decimation filter, a symmetric filter, and an asymmetric filter. Two or more segment cells are configurable to be connected in cascade to form at least one of an interpolation filter, a decimation filter, a symmetric filter, an asymmetric filter, a complex symmetric filter, and a complex asymmetric filter. A first segment cell of the plurality of segment cells outputs first, second, third, and fourth output signals. The first segment cell includes first through thirteenth multiplexers, first through fourth adders, first and second multipliers, an accumulator, and first and second tapped delay lines. The first multiplexer receives a first input signal and a second input signal. The first multiplexer outputs a first intermediate signal based on a first control signal. The second multiplexer receives a third input signal and the first intermediate signal. The second multiplexer outputs a second intermediate signal based on a second control signal. The first tapped delay line receives the second intermediate signal. The first tapped delay line includes first and second filter taps for generating first and second tapped signals based on a first enable signal, respectively. The first segment cell outputs the second tapped signal as the first output signal. The third multiplexer receives a fourth input signal and the first output signal. The third multiplexer outputs a third intermediate signal based on a third control signal. The fourth multiplexer receives a fifth input signal, the first intermediate signal, and the third intermediate signal. The fourth multiplexer outputs a fourth intermediate signal based on the second control signal and a fourth control signal. The second tapped delay line receives the fourth intermediate signal. The second tapped delay line includes third and fourth filter taps for generating third and fourth tapped signals based on a second enable signal, respectively. The first segment cell outputs the fourth tapped signal as the second output signal. The first adder receives the first and fourth tapped signals and generates a first adder signal. The second adder receives the second and third tapped signals and generates a second adder signal. The fifth multiplexer receives the first tapped signal and the first adder signal. The fifth multiplexer outputs a fifth intermediate signal based on the fourth control signal. The sixth multiplexer receives the second tapped signal and the second adder signal. The sixth multiplexer outputs a sixth intermediate signal based on the fourth control signal. The seventh multiplexer receives the fifth intermediate signal and the third tapped signal. The seventh multiplexer outputs a seventh intermediate signal based on a fifth control signal. The eighth multiplexer receives the sixth intermediate signal and the fourth tapped signal. The eighth multiplexer outputs an eighth intermediate signal based on the fifth control signal. The ninth multiplexer receives first and second signals indicative of first and second coefficient values, respectively. The ninth multiplexer outputs a ninth intermediate signal based on a sixth control signal. The ninth intermediate signal is indicative of a first value. The tenth multiplexer receives third and fourth signals indicative of third and fourth coefficient values, respectively. The tenth multiplexer outputs a tenth intermediate signal based on the sixth control signal. The tenth intermediate signal is indicative of a second value. The first multiplier receives the seventh and ninth intermediate signals. The first multiplier multiplies the seventh intermediate signal with the first value and generates a first multiplier output signal. The second multiplier receives the eighth and tenth intermediate signals. The second multiplier multiplies the eighth intermediate signal with the second value and generates a second multiplier output signal. The eleventh multiplexer receives the first input signal and a first logic low signal. The eleventh multiplexer outputs an eleventh intermediate signal based on a seventh control signal. The third adder receives the first multiplier output signal, the second multiplier output signal, and the eleventh intermediate signal. The third adder generates a third adder signal. The twelfth multiplexer receives the first and second input signals. The twelfth multiplexer outputs a twelfth intermediate signal based on an eighth control signal. The first segment cell outputs the twelfth intermediate signal as the third output signal. The first accumulator receives the third adder signal and generates a first accumulator signal. The fourth adder receives the twelfth intermediate signal and the third adder signal and generates a fourth adder signal. The thirteenth multiplexer receives the third adder signal, the first accumulator signal, and the fourth adder signal. The thirteenth multiplexer outputs the fourth output signal based on a ninth control signal. The ninth control signal is a multi-bit signal.

Various embodiments of the present invention provide a finite impulse response (FIR) filter circuit. The FIR filter circuit includes a plurality of segment cells. Each segment cell of the plurality of segment cells is configurable as at least one of an interpolation filter, a decimation filter, a symmetric filter, and an asymmetric filter. Two or more segment cells of the plurality of segment cells are configurable to be connected in cascade to form an at least one of an interpolation filter, a decimation filter, a symmetric filter, an asymmetric filter, a complex symmetric filter, and a complex asymmetric filter. The FIR filter circuit includes registers corresponding to the segment cells for storing coefficient values of the corresponding segment cells. The FIR filter circuit further includes control circuits corresponding to the segment cells for generating control signals.

The FIR filter circuit provides flexibility to cascade two or more segment cells to form at least one of an interpolation filter, a decimation filter, a symmetric filter, an asymmetric filter, a complex symmetric filter, and a complex asymmetric filter. The number of filter taps in delay lines of the segment cells can be varied as per requirement. Further, the FIR filter circuit can be designed to achieve any interpolation and decimation factors. The FIR filter circuit uses pre-adders for reducing the number of multipliers required when a segment cell or more than one segment cell are configured as a symmetric filter, thereby reducing area requirement. Further, the FIR filter circuit can be configured for various signal processing applications such as, but not limited to, image processing application, audio processing application, video processing application, and quadrature error compensation.

Referring now to FIG. 1, a schematic block diagram of a finite impulse response (FIR) filter circuit 100 in accordance with an embodiment of the present invention is shown. The FIR filter circuit 100 includes first and second segment cells 102a and 102b (collectively referred to as "segment cells 102"). The FIR filter circuit 100 further includes first and second control circuits 104a and 104b corresponding to the first and second segment cells 102a and 102b. The FIR filter circuit 100 includes first and second registers 106a and 106b corresponding to the first and second segment cells 102a and 102b.

Figure 2:
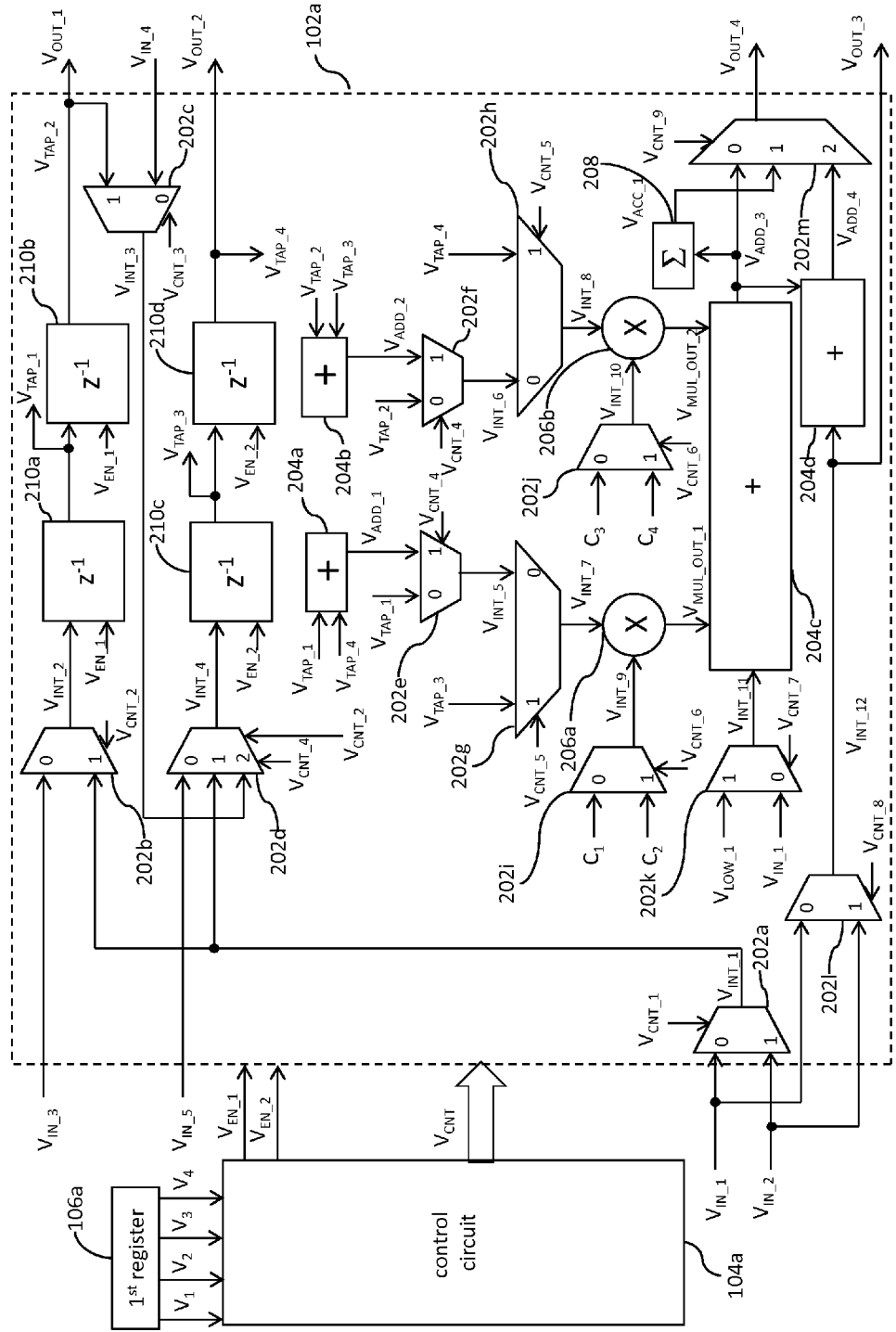
FIG. 2 is a schematic block diagram of the first segment cell of FIG. 1 in accordance with an embodiment of the present invention.

Referring now to FIG. 2, a schematic block diagram of the first segment cell 102a in accordance with an embodiment of the present invention is shown. The first segment cell 102a includes first through thirteenth muxes 202a-202m, first through fourth adders 204a-204d, first and second multipliers 206a and 206b, and a first accumulator 208. The first segment cell 102a further includes first through fourth filter taps 210a-210d. The first and second filter taps 210a and 210b are connected in cascade and form a first tapped delay line. The third and fourth filter taps 210c and 210d are connected in cascade and form a second tapped delay line.

The first register 106a stores first through fourth coefficient values ($C_1$-$C_4$) and outputs first through fourth signals ($V_1$-$V_4$), respectively.

The first control circuit 104a generates a first set of signals including first and second enable signals ($V_{EN\_1}$ and $V_{EN\_2}$) and first through ninth control signals ($V_{CNT\_1}$-$V_{CNT\_9}$). In an example, the first control circuit 104a is connected to the first register 106a for receiving the first through fourth signals.

The first mux 202a has a first input terminal for receiving a first input signal ($V_{IN\_1}$) and a second input terminal for receiving a second input signal ($V_{IN\_2}$). The first mux 202a has a select terminal connected to the first control circuit 104a for receiving the first control signal and an output terminal for outputting a first intermediate signal ($V_{INT\_1}$). The first mux 202a outputs the first input signal as the first intermediate signal when the first control signal is at logic low state. The first mux 202a outputs the second input signal as the first intermediate signal when the first control signal is at logic high state.

The second mux 202b has a first input terminal for receiving a third input signal ($V_{IN\_3}$) and a second input terminal connected to the output terminal of the first mux 202a for receiving the first intermediate signal. The second mux 202b has a select terminal connected to the first control circuit 104a for receiving the second control signal and an output terminal for outputting a second intermediate signal ($V_{INT\_2}$). The second mux 202b outputs the third input signal as the second intermediate signal when the second control signal is at logic low state. The second mux 202b outputs the first intermediate signal as the second intermediate signal when the second control signal is at logic high state.

The first tapped delay line is connected to the output terminal of the second mux 202b for receiving the second intermediate signal. The first tapped delay line is further connected to the first control circuit 104a for receiving the first enable signal. The first and second filter taps 210a and 210b generate first and second tapped signals ($V_{TAP\_1}$ and $V_{TAP\_2}$), respectively, based on the first enable signal. The first and second filter taps 210a and 210b are enabled when the first control circuit 104a enables the first enable signal. The first segment cell 102a outputs the second tapped signal as a first output signal ($V_{OUT\_1}$).

The third mux 202c has a first input terminal for receiving a fourth input signal ($V_{IN\_4}$) and a second input terminal connected to the first tapped delay line for receiving the first output signal. The third mux 202c has a select terminal connected to the first control circuit 104a for receiving the third control signal and an output terminal for outputting a third intermediate signal ($V_{INT\_3}$). The third mux 202c outputs the fourth input signal as the third intermediate signal when the third control signal is at logic low state. The third mux 202c outputs the first output signal as the third intermediate signal when the third control signal is at logic high state.

The fourth mux 202d has a first input terminal for receiving a fifth input signal ($V_{IN\_5}$), a second input terminal connected to the output terminal of the first mux 202a for receiving the first intermediate signal, and a third input terminal connected to the output terminal of the third mux 202c for receiving the third intermediate signal. The fourth mux 202d has a two-bit select terminal connected to the first control circuit 104a for receiving the second and fourth control signals and an output terminal for outputting a fourth intermediate signal ($V_{INT\_4}$). The fourth mux 202d outputs the fifth input signal as the fourth intermediate signal when the second and fourth control signals are at logic low state. The fourth mux 202d outputs the first intermediate signal as the fourth intermediate signal when the second and fourth control signals are at logic high and logic low states, respectively. The fourth mux 202d outputs the third intermediate signal as the fourth intermediate signal when the second and fourth control signals are at logic low and logic high states, respectively. In an embodiment, the fourth mux 202d has a fourth input terminal connected to the output terminal of the third mux 202c for receiving the third intermediate signal.

The second tapped delay line is connected to the output terminal of the fourth mux 202d for receiving the fourth intermediate signal. The second tapped delay line is further connected to the first control circuit 104a for receiving the second enable signal. The third and fourth filter taps 210c and 210d generate third and fourth tapped signals ($V_{TAP\_3}$ and $V_{TAP\_4}$), respectively, based on the second enable signal. The third and fourth filter taps 210c and 210d are enabled when the first control circuit 104a enables the second enable signal. The first segment cell 102a outputs the fourth tapped signal as a second output signal ($V_{OUT\_2}$).

The first adder 204a has first and second input terminals connected to the first and fourth filter taps 210a and 210d for receiving the first and fourth tapped signals, respectively. The first adder 204a has an output terminal for generating a first adder signal ($V_{ADD\_1}$).

The second adder 204b has first and second input terminals connected to the second and third filter taps 210b and 210c for receiving the second and third tapped signals, respectively. The second adder 204b has an output terminal for generating a second adder signal ($V_{ADD\_2}$).

The fifth mux 202e has a first input terminal connected to the first filter tap 210a for receiving the first tapped signal and a second input terminal connected to the output terminal of the first adder 204a for receiving the first adder signal. The fifth mux 202e has a select terminal connected to the first control circuit 104a for receiving the fourth control signal and an output terminal for outputting a fifth intermediate signal ($V_{INT\_5}$). The fifth mux 202e outputs the first tapped signal as the fifth intermediate signal when the fourth control signal is at logic low state. The fifth mux 202e outputs the first adder signal as the fifth intermediate signal when the fourth control signal is at logic high state.

The sixth mux 202f has a first input terminal connected to the second filter tap 210b for receiving the second tapped signal and a second input terminal connected to the output terminal of the second adder 204b for receiving the second adder signal. The sixth mux 202f has a select terminal connected to the first control circuit 104a for receiving the fourth control signal and an output terminal for outputting a sixth intermediate signal ($V_{INT\_6}$). The sixth mux 202f outputs the second tapped signal as the sixth intermediate signal when the fourth control signal is at logic low state. The sixth mux 202f outputs the second adder signal as the sixth intermediate signal when the fourth control signal is at logic high state.

The seventh mux 202g has a first input terminal connected to the output terminal of the fifth mux 202e for receiving the fifth intermediate signal and a second input terminal connected to the third filter tap 210c for receiving the third tapped signal. The seventh mux 202g has a select terminal connected to the first control circuit 104a for receiving the fifth control signal and an output terminal for outputting a seventh intermediate signal ($V_{INT\_7}$). The seventh mux 202g outputs the fifth intermediate signal as the seventh intermediate signal when the fifth control signal is at logic low state. The seventh mux 202g outputs the third tapped signal as the seventh intermediate signal when the fifth control signal is at logic high state.

The eighth mux 202h has a first input terminal connected to the output terminal of the sixth mux 202f for receiving the sixth intermediate signal and a second input terminal connected to the fourth filter tap 210d for receiving the fourth tapped signal. The eighth mux 202h has a select terminal connected to the first control circuit 104a for receiving the fifth control signal and an output terminal for outputting an eighth intermediate signal ($V_{INT\_8}$). The eighth mux 202h outputs the sixth intermediate signal as the eighth intermediate signal when the fifth control signal is at logic low state. The eighth mux 202h outputs the fourth tapped signal as the eighth intermediate signal when the fifth control signal is at logic high state.

The ninth mux 202i has a first input terminal for receiving the first signal and a second input terminal for receiving the second signal. The ninth mux 202i has a select terminal connected to the first control circuit 104a for receiving the sixth control signal and an output terminal for outputting a ninth intermediate signal ($V_{INT\_9}$). The ninth intermediate signal is indicative of a first value. The ninth mux 202i outputs the first signal as the ninth intermediate signal when the sixth control signal is at logic low state. The ninth mux 202i outputs the second signal as the ninth intermediate signal when the sixth control signal is at logic high state.

The tenth mux 202j has a first input terminal for receiving the third signal and a second input terminal for receiving the fourth signal. The tenth mux 202j has a select terminal connected to the first control circuit 104a for receiving the sixth control signal and an output terminal for outputting a tenth intermediate signal ($V_{INT\_10}$). The tenth intermediate signal is indicative of a second value. The tenth mux 202j outputs the third signal as the tenth intermediate signal when the sixth control signal is at logic low state. The tenth mux 202j outputs the fourth signal as the tenth intermediate signal when the sixth control signal is at logic high state.

The first multiplier 206a is connected to the output terminals of the seventh and ninth muxes 202g and 202i for receiving the seventh and ninth intermediate signals, respectively. The first multiplier 206a multiplies the seventh intermediate signal with the first value and generates a first multiplier output signal ($V_{MUL\_OUT\_1}$).

The second multiplier 206b is connected to the output terminals of the eighth and tenth muxes 202h and 202j for receiving the eighth and tenth intermediate signals, respectively. The second multiplier 206b multiplies the eighth intermediate signal with the second value and generates a second multiplier output signal ($V_{MUL\_OUT\_2}$).

The eleventh mux 202k has a first input terminal for receiving the first input signal and a second input terminal for receiving a first logic low signal ($V_{LOW\_1}$). The eleventh mux 202k has a select terminal connected to the first control circuit 104a for receiving the seventh control signal and an output terminal for outputting an eleventh intermediate signal ($V_{INT\_11}$). The eleventh mux 202k outputs the first input signal as the eleventh intermediate signal when the seventh control signal is at logic low state. The eleventh mux 202k outputs the first logic low signal as the eleventh intermediate signal when the seventh control signal is at logic high state.

The third adder 204c has first, second, and third input terminals connected to the first multiplier 206a, the second multiplier 206b, and the output terminal of the eleventh mux 202k for receiving the first multiplier output signal, the second multiplier output signal, and the eleventh intermediate signal, respectively. The third adder 204c has an output terminal for generating a third adder signal ($V_{ADD\_3}$).

The twelfth mux 202l has first and second input terminals for receiving the first and second input signals, respectively. The twelfth mux 202l has a select terminal connected to the first control circuit 104a for receiving the eighth control signal and an output terminal for outputting a twelfth intermediate signal ($V_{INT\_12}$). The twelfth mux 202l outputs the first input signal as the twelfth intermediate signal when the eighth control signal is at logic low state. The twelfth mux 202l outputs the second input signal as the twelfth intermediate signal when the eighth control signal is at logic high state. The first segment cell 102a outputs the twelfth intermediate signal as a third output signal ($V_{OUT\_3}$).

The first accumulator 208 is connected to the output terminal of the third adder 204c for receiving the third adder signal. The first accumulator 208 generates a first accumulator signal ($V_{ACC\_1}$).

The fourth adder 204d has first and second input terminals connected to the output terminals of the twelfth mux 202l and the third adder 204c for receiving the twelfth intermediate signal and the third adder signal, respectively. The fourth adder 204d has an output terminal for generating a fourth adder signal ($V_{ADD\_4}$).

The thirteenth mux 202m has a first input terminal connected to the output terminal of the third adder 204c for receiving the third adder signal, a second input terminal connected to the first accumulator 208 for receiving the first accumulator signal, and a third input terminal connected to the output terminal of the fourth adder 204d for receiving the fourth adder signal. The thirteenth mux 202m has a two-bit select terminal for receiving the ninth control signal and an output terminal for outputting a fourth output signal ($V_{OUT\_4}$). The ninth control signal is a multi-bit signal. The thirteenth mux 202m outputs the third adder signal as the fourth output signal when a value corresponding to the ninth control signal is zero. The thirteenth mux 202m outputs the first accumulator signal as the fourth output signal when the value corresponding to the ninth control signal is one. The thirteenth mux 202m outputs the fourth adder signal as the fourth output signal when the value corresponding to the ninth control signal is two.

Figure 3:
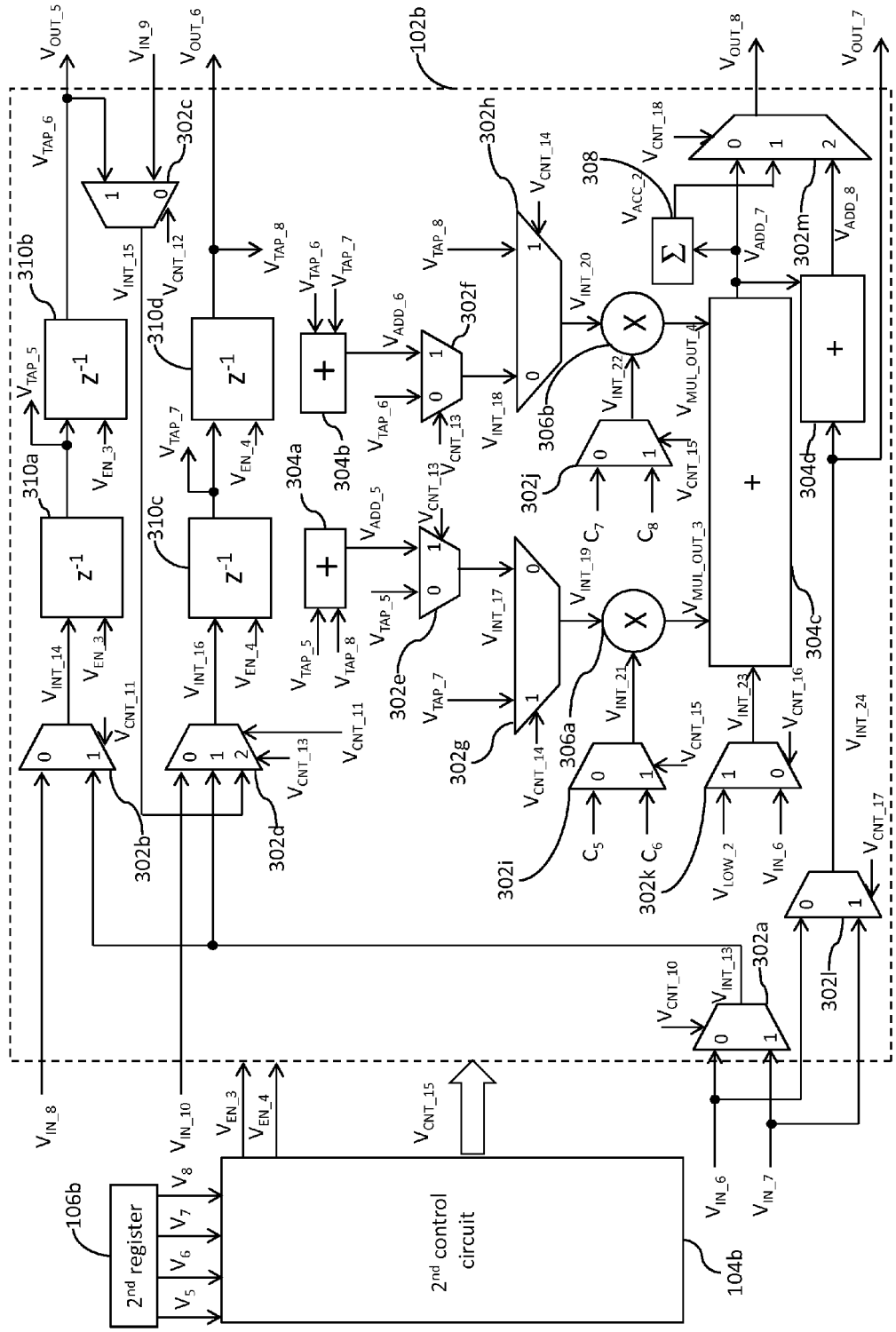
FIG. 3 is a schematic block diagram of the second segment cell of FIG. 1 in accordance with an embodiment of the present invention.

Referring now to FIG. 3, a schematic block diagram of the second segment cell 102b in accordance with an embodiment of the present invention is shown. The second segment cell 102b includes fourteenth through twenty-sixth muxes 302a-302m, fifth through eighth adders 304a-304d, third and fourth multipliers 306a and 306b, and a second accumulator 308. The second segment cell 102b further includes fifth through eighth filter taps 310a-310d. The fifth and sixth filter taps 310a and 310b are connected in cascade and form a third tapped delay line. The seventh and eighth filter taps 310c and 310d are connected in cascade and form a fourth tapped delay line.

The second register 106b stores fifth through eighth coefficient values ($C_5$-$C_8$) and outputs fifth through eighth signals ($V_5$-$V_8$), respectively.

The second control circuit 104b generates a second set of signals including third and fourth enable signals ($V_{EN\_3}$ and $V_{EN\_4}$) and tenth through eighteenth control signals ($V_{CNT\_10}$-$V_{CNT\_18}$). In an example, the second control circuit 104b is connected to the second register 106b for receiving the fifth through eighth signals.

The fourteenth mux 302a has a first input terminal for receiving a sixth input signal ($V_{IN\_6}$) and a second input terminal for receiving a seventh input signal ($V_{IN\_7}$). The fourteenth mux 302a has a select terminal connected to the second control circuit 104b for receiving the tenth control signal and an output terminal for outputting a thirteenth intermediate signal ($V_{INT\_13}$). The fourteenth mux 302a outputs the sixth input signal as the thirteenth intermediate signal when the tenth control signal is at logic low state. The fourteenth mux 302a outputs the seventh input signal as the thirteenth intermediate signal when the tenth control signal is at logic high state.

The fifteenth mux 302b has a first input terminal for receiving an eighth input signal ($V_{IN\_8}$) and a second input terminal connected to the output terminal of the fourteenth mux 302a for receiving the thirteenth intermediate signal. The fifteenth mux 302b has a select terminal connected to the second control circuit 104b for receiving the eleventh control signal and an output terminal for outputting a fourteenth intermediate signal ($V_{INT\_14}$). The fifteenth mux 302b outputs the eighth input signal as the fourteenth intermediate signal when the eleventh control signal is at logic low state. The fifteenth mux 302b outputs the thirteenth intermediate signal as the fourteenth intermediate signal when the eleventh control signal is at logic high state.

The third tapped delay line is connected to the output terminal of the fifteenth mux 302b for receiving the fourteenth intermediate signal. The third tapped delay line is further connected to the second control circuit 104b for receiving the third enable signal. The fifth and sixth filter taps 310a and 310b generate fifth and sixth tapped signals ($V_{TAP\_5}$ and $V_{TAP\_6}$), respectively, based on the third enable signal. The fifth and sixth filter taps 310a and 310b are enabled when the second control circuit 104b enables the third enable signal. The second segment cell 102b outputs the sixth tapped signal as a fifth output signal ($V_{OUT\_5}$).

The sixteenth mux 302c has a first input terminal for receiving a ninth input signal ($V_{IN\_9}$) and a second input terminal connected to the third tapped delay line for receiving the fifth output signal. The sixteenth mux 302c has a select terminal connected to the second control circuit 104b for receiving the twelfth control signal and an output terminal for outputting a fifteenth intermediate signal ($V_{INT\_15}$). The sixteenth mux 302c outputs the ninth input signal as the fifteenth intermediate signal when the twelfth control signal is at logic low state. The sixteenth mux 302c outputs the fifth output signal as the fifteenth intermediate signal when the twelfth control signal is at logic high state.

The seventeenth mux 302d has a first input terminal for receiving a tenth input signal ($V_{IN\_10}$), a second input terminal connected to the output terminal of the fourteenth mux 302a for receiving the thirteenth intermediate signal, and a third input terminal connected to the output terminal of the sixteenth mux 302c for receiving the fifteenth intermediate signal. The seventeenth mux 302d has a two-bit select terminal connected to the second control circuit 104b for receiving the eleventh and thirteenth control signals and an output terminal for outputting a sixteenth intermediate signal ($V_{INT\_16}$). The seventeenth mux 302d outputs the tenth input signal as the sixteenth intermediate signal when the eleventh and thirteenth control signals are at logic low state. The seventeenth mux 302d outputs the thirteenth intermediate signal as the sixteenth intermediate signal when the eleventh and thirteenth control signals are at logic high and logic low states, respectively. The seventeenth mux 302d outputs the fifteenth intermediate signal as the sixteenth intermediate signal when the eleventh and thirteenth control signals are at logic low and logic high states, respectively. In an embodiment, the seventeenth mux 302d has a fourth input terminal connected to the output terminal of the sixteenth mux 302c for receiving the fifteenth intermediate signal.

The fourth tapped delay line is connected to the output terminal of the seventeenth mux 302d for receiving the sixteenth intermediate signal. The fourth tapped delay line is further connected to the second control circuit 104b for receiving the fourth enable signal. The seventh and eighth filter taps 310c and 310d generate seventh and eighth tapped signals ($V_{TAP\_7}$ and $V_{TAP\_8}$), respectively, based on the fourth enable signal. The seventh and eighth filter taps 310c and 310d are enabled when the second control circuit 104b enables the fourth enable signal. The second segment cell 102b outputs the eighth tapped signal as a sixth output signal ($V_{OUT\_6}$).

The fifth adder 304a has first and second input terminals connected to the fifth and eighth filter taps 310a and 310d for receiving the fifth and eighth tapped signals, respectively. The fifth adder 304a has an output terminal for generating a fifth adder signal ($V_{ADD\_5}$).

The sixth adder 304b has first and second input terminals connected to the sixth and seventh filter taps 310b and 310c for receiving the sixth and seventh tapped signals, respectively. The sixth adder 304b has an output terminal for generating a sixth adder signal ($V_{ADD\_6}$).

The eighteenth mux 302e has a first input terminal connected to the fifth filter tap 310a for receiving the fifth tapped signal and a second input terminal connected to the output terminal of the fifth adder 304a for receiving the fifth adder signal. The eighteenth mux 302e has a select terminal connected to the second control circuit 104b for receiving the thirteenth control signal and an output terminal for outputting a seventeenth intermediate signal ($V_{INT\_17}$). The eighteenth mux 302e outputs the fifth tapped signal as the seventeenth intermediate signal when the thirteenth control signal is at logic low state. The eighteenth mux 302e outputs the fifth adder signal as the seventeenth intermediate signal when the thirteenth control signal is at logic high state.

The nineteenth mux 302f has a first input terminal connected to the sixth filter tap 310b for receiving the sixth tapped signal and a second input terminal connected to the output terminal of the sixth adder 304b for receiving the sixth adder signal. The nineteenth mux 302f has a select terminal connected to the second control circuit 104b for receiving the thirteenth control signal and an output terminal for outputting an eighteenth intermediate signal ($V_{INT\_18}$). The nineteenth mux 302f outputs the sixth tapped signal as the eighteenth intermediate signal when the thirteenth control signal is at logic low state. The nineteenth mux 302f outputs the sixth adder signal as the eighteenth intermediate signal when the thirteenth control signal is at logic high state.

The twentieth mux 302g has a first input terminal connected to the output terminal of the eighteenth mux 302e for receiving the seventeenth intermediate signal and a second input terminal connected to the seventh filter tap 310c for receiving the seventh tapped signal. The twentieth mux 302g has a select terminal connected to the second control circuit 104b for receiving the fourteenth control signal and an output terminal for outputting a nineteenth intermediate signal ($V_{INT\_19}$). The twentieth mux 302g outputs the seventeenth intermediate signal as the nineteenth intermediate signal when the fourteenth control signal is at logic low state. The twentieth mux 302g outputs the seventh tapped signal as the nineteenth intermediate signal when the fourteenth control signal is at logic high state.

The twenty-first mux 302h has a first input terminal connected to the output terminal of the nineteenth mux 302f for receiving the eighteenth intermediate signal and a second input terminal connected to the eighth filter tap 310d for receiving the eighth tapped signal. The twenty-first mux 302h has a select terminal connected to the second control circuit 104b for receiving the fourteenth control signal and an output terminal for outputting a twentieth intermediate signal ($V_{INT\_20}$). The twenty-first mux 302h outputs the eighteenth intermediate signal as the twentieth intermediate signal when the fourteenth control signal is at logic low state. The twenty-first mux 302h outputs the eighth tapped signal as the twentieth intermediate signal when the fourteenth control signal is at logic high state.

The twenty-second mux 302i has a first input terminal for receiving the fifth signal and a second input terminal for receiving the sixth signal. The twenty-second mux 302i has a select terminal connected to the second control circuit 104b for receiving the fifteenth control signal and an output terminal for outputting a twenty-first intermediate signal ($V_{INT\_21}$). The twenty-first intermediate signal is indicative of a third value. The twenty-second mux 302i outputs the fifth signal as the twenty-first intermediate signal when the fifteenth control signal is at logic low state. The twenty-second mux 302i outputs the sixth signal as the twenty-first intermediate signal when the fifteenth control signal is at logic high state.

The twenty-third mux 302j has a first input terminal for receiving the seventh signal and a second input terminal for receiving the eighth signal. The twenty-third mux 302j has a select terminal connected to the second control circuit 104b for receiving the fifteenth control signal and an output terminal for outputting a twenty-second intermediate signal ($V_{INT\_22}$). The twenty-second intermediate signal is indicative of a fourth value. The twenty-third mux 302j outputs the seventh signal as the twenty-second intermediate signal when the fifteenth control signal is at logic low state. The twenty-third mux 302j outputs the eighth signal as the twenty-second intermediate signal when the fifteenth control signal is at logic high state.

The third multiplier 306a is connected to the output terminals of the twentieth and twenty-second muxes 302g and 302i for receiving the nineteenth and twenty-first intermediate signals, respectively. The third multiplier 306a multiplies the nineteenth intermediate signal with the third value and generates a third multiplier output signal ($V_{MUL\_OUT\_3}$).

The fourth multiplier 306b is connected to the output terminals of the twenty-first and twenty-third muxes 302h and 302j for receiving the twentieth and twenty-second intermediate signals, respectively. The fourth multiplier 306b multiplies the twentieth intermediate signal with the fourth value and generates a fourth multiplier output signal ($V_{MUL\_OUT\_4}$).

The twenty-fourth mux 302k has a first input terminal for receiving the sixth input signal and a second input terminal for receiving a second logic low signal ($V_{LOW\_2}$). The twenty-fourth mux 302k has a select terminal connected to the second control circuit 104b for receiving the sixteenth control signal and an output terminal for outputting a twenty-third intermediate signal ($V_{INT\_23}$). The twenty-fourth mux 302k outputs the sixth input signal as the twenty-third intermediate signal when the sixteenth control signal is at logic low state. The twenty-fourth mux 302k outputs the second logic low signal as the twenty-third intermediate signal when the sixteenth control signal is at logic high state.

The seventh adder 304c has first, second, and third input terminals connected to the third multiplier 306a, the fourth multiplier 306b, and the output terminal of the twenty-fourth mux 302k for receiving the third multiplier output signal, the fourth multiplier output signal, and the twenty-third intermediate signal, respectively. The seventh adder 304c has an output terminal for generating a seventh adder signal ($V_{ADD\_7}$).

The twenty-fifth mux 302l has first and second input terminals for receiving the sixth and seventh input signals, respectively. The twenty-fifth mux 302l has a select terminal connected to the second control circuit 104b for receiving the seventeenth control signal and an output terminal for outputting a twenty-fourth intermediate signal ($V_{INT\_24}$). The twenty-fifth mux 302l outputs the sixth input signal as the twenty-fourth intermediate signal when the seventeenth control signal is at logic low state. The twenty-fifth mux 302l outputs the seventh input signal as the twenty-fourth intermediate signal when the seventeenth control signal is at logic high state. The second segment cell 102b outputs the twenty-fourth intermediate signal as a seventh output signal ($V_{OUT\_7}$).

The second accumulator 308 is connected to the output terminal of the seventh adder 304c for receiving the seventh adder signal. The second accumulator 308 generates a second accumulator signal ($V_{ACC\_2}$).

The eighth adder 304d has first and second input terminals connected to the output terminals of the twenty-fifth mux 302l and the seventh adder 304c for receiving the twenty-fourth intermediate signal and the seventh adder signal, respectively. The eighth adder 304d has an output terminal for generating an eighth adder signal ($V_{ADD\_8}$).

The twenty-sixth mux 302m has a first input terminal connected to the output terminal of the seventh adder 304c for receiving the seventh adder signal, a second input terminal connected to the second accumulator 308 for receiving the second accumulator signal, and a third input terminal connected to the output terminal of the eighth adder 304d for receiving the eighth adder signal. The twenty-sixth mux 302m has a two-bit select terminal for receiving the eighteenth control signal and an output terminal for outputting an eighth output signal ($V_{OUT\_8}$). The eighteenth control signal is a multi-bit signal. The twenty-sixth mux 302m outputs the seventh adder signal as the eighth output signal when a value corresponding to the eighteenth control signal is zero. The twenty-sixth mux 302m outputs the second accumulator signal as the eighth output signal when the value corresponding to the eighteenth control signal is one. The twenty-sixth mux 302m outputs the eighth adder signal as the eighth output signal when the value corresponding to the eighteenth control signal is two.

In an embodiment of the invention, the first control circuit 104a includes a third register (not shown) for storing a first set of values. The first set of values includes values that are indicative of the first control signal, the second control signal, the third control signal, the fourth control signal, the seventh control signal, and the eighth control signal. The first set of values further includes values that are indicative of the input and output operating frequencies of the first segment cell 102a. The second control circuit 104b includes a fourth register (not shown) for storing a second set of values. The second set of values includes values that are indicative of the tenth control signal, the eleventh control signal, the twelfth control signal, the thirteenth control signal, the sixteenth control signal, and the seventeenth control signal. The second set of values further includes values that are indicative of the input and output operating frequencies of the second segment cell 102b. In an example, the input and output operating frequencies of the first and second segment cells 102a and 102b are generated based on a clock frequency of a system that includes the FIR filter circuit 100.

A user can configure each segment cell 102 as at least one of an interpolation filter, a decimation filter, a symmetric filter, and an asymmetric filter. In an example, the user can configure the first segment cell 102a as at least one of an interpolation filter, a decimation filter, a symmetric filter, and an asymmetric filter by providing the first set of values.

Thus, the first control circuit 104a generates the first control signal, the second control signal, the third control signal, the fourth control signal, the seventh control signal, and the eighth control signal based on the first set of values. The user further provides first and second ratios. The first ratio is the ratio of the clock frequency of the system (hereinafter referred to as "system clock frequency") to the input operating frequency of the first segment cell 102a. The second ratio is the ratio of the system clock frequency to the output operating frequency of the first segment cell 102a. The first control circuit 104a generates the first and second enable signals and the fifth and sixth control signals based on the first and second ratios. In an embodiment, the user provides a value indicative of the ninth control signal when the first segment cell 102a is configured as at least one of an interpolation filter, a symmetric filter, and an asymmetric filter. In another embodiment, the first control circuit 104a generates the ninth control signal based on at least one of the first set of values and the first and second ratios.

Figure 4:
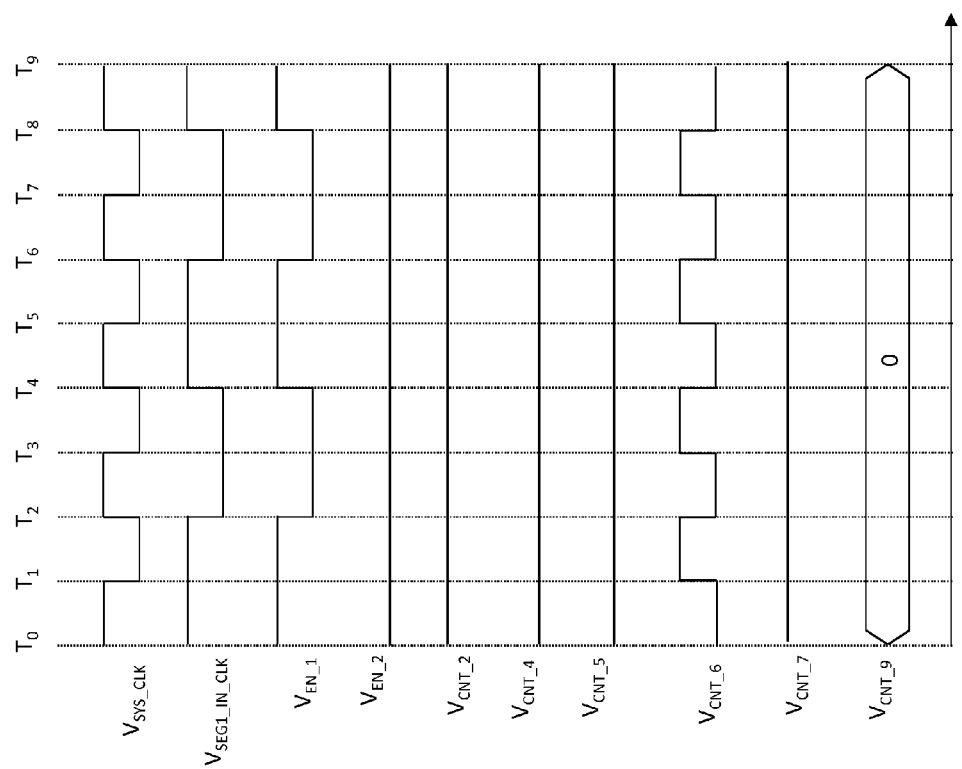
FIG. 4 is a timing diagram illustrating control signals when the first segment cell is configured as an interpolation filter in accordance with an embodiment of the present invention.

Referring now to FIG. 4, a timing diagram illustrating the control signals when the first segment cell 102a is configured as an interpolation filter in accordance with an embodiment of the present invention is shown. In an example, the values corresponding to the first control signal, the second control signal, the fourth control signal, the seventh control signal, and the ninth control signal in the first set of values are zero, one, zero, one, and zero, respectively. The first ratio is 2 and the second ratio is 1. Thus, the input operating frequency of the first segment cell 102a ($V_{SEG1\_IN\_CLK}$) is half times the system clock frequency ($V_{SYS\_CLK}$). The output operating frequency of the first segment cell 102a is equal to the system clock frequency. Hence, the interpolation factor is 2. The first control circuit 104a generates the first, second, fourth, seventh, and ninth control signals at logic low state, logic high state, logic low state, logic high state, and logic low state, respectively. The first control circuit 104a generates the second enable signal and the fifth control signal at logic low state.

The first control circuit 104a generates the first enable signal at a frequency equal to the input operating frequency of the first segment cell 102a. Thus, the first and second filter taps 210a and 210b latch values of corresponding input signals for a time period corresponding to the input operating frequency of the first segment cell 102a for generating the first and second tapped signals, respectively. As the interpolation factor is 2, the first control circuit 104a generates the sixth control signal at a frequency that is twice the input operating frequency of the first segment cell 102a.

During time period T0-T1, the first control circuit 104a generates the sixth control signal at logic low state. Thus, the first and second multipliers 206a and 206b multiply the first and second tapped signals with the first and third coefficient values, respectively, thereby generating a weighted first tapped signal and a weighted second tapped signal as the first and second multiplier output signals, respectively. The third adder 204c adds the first and second multiplier output signals for generating a first intermediate adder signal as the third adder signal. The thirteenth mux 202m outputs the third adder signal as the fourth output signal.

During time period T1-T2, as the first control circuit 104a generates the sixth control signal at logic high state, the first and second multipliers 206a and 206b multiply the first and second tapped signals with the second and fourth coefficient values, respectively, thereby generating a weighted first tapped signal and a weighted second tapped signal as the first and second multiplier output signals, respectively. The third adder 204c adds the first and second multiplier output signals for generating a second intermediate adder signal as the third adder signal. The thirteenth mux 202m outputs the third adder signal as the fourth output signal.

Thus, the first segment cell 102a outputs at a frequency that is twice the input operating frequency thereof.

Figure 5:
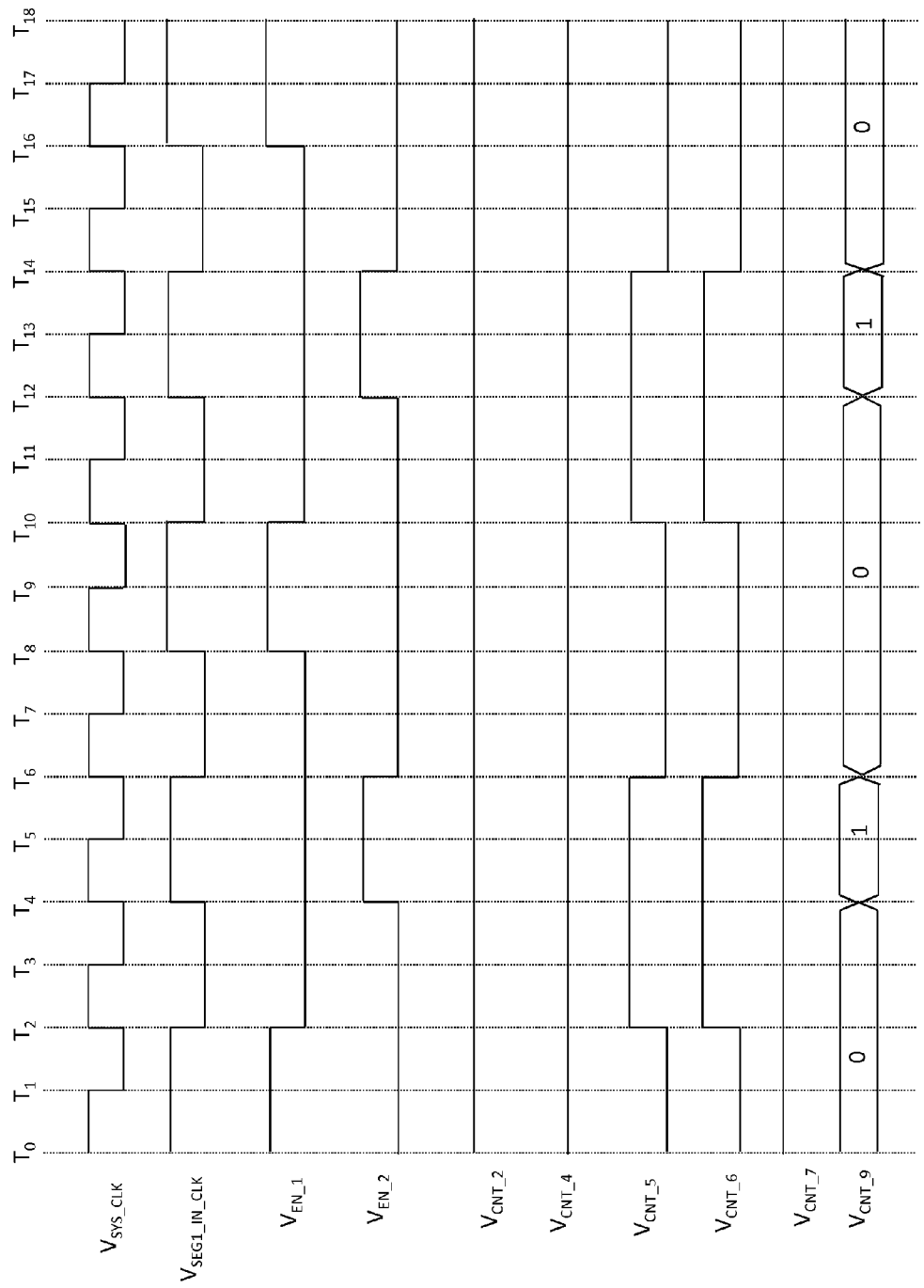
FIG. 5 is a timing diagram illustrating the control signals when the first segment cell is configured as a decimation filter in accordance with an embodiment of the present invention.

Referring now to FIG. 5, a timing diagram illustrating the control signals when the first segment cell 102a is configured as a decimation filter in accordance with an embodiment of the present invention is shown. In an example, the values corresponding to the first control signal, the second control signal, the fourth control signal, and the seventh control signal are zero, one, zero, and one, respectively. In the example, the first ratio is 2 and the second ratio is 4. Thus, the input operating frequency of the first segment cell 102a is half times the system clock frequency. The output operating frequency of the first segment cell 102a is one fourth times the system clock frequency. Hence, the decimation factor is 2.

The first control circuit 104a generates the first and second enable signals at a frequency that is half times the input operating frequency of the first segment cell 102a. Thus, the first through fourth filters taps 210a-210d latch values of corresponding input signals for a time period corresponding to a frequency that is half times the input operating frequency of the first segment cell 102a. The first control circuit 104a generates the first control signal, the second control signal, the fourth control signal, and the seventh control signal at logic low state, logic high state, logic low state, and logic high state, respectively.

During time period T0-T2, the first control circuit 104a generates the first enable signal at logic high state and the fifth and sixth control signals at logic low state. Thus, the first and second filter taps 210a and 210b latch corresponding input signals and generate the first and second tapped signals, respectively. The first and second multipliers 206a and 206b multiply the first and second tapped signals with the first coefficient value and the third coefficient value, respectively, thereby generating a weighted first tapped signal and a weighted second tapped signal as the first and second multiplier output signals, respectively. The third adder 204c adds the first and second multiplier output signals for generating the third adder signal.

During time period T2-T4, the first control circuit 104a generates the first and second enable signals at logic low state. Hence, the first through fourth filter taps 210a-210d are disabled.

During time period T4-T6, the first control circuit 104a generates the second enable signal at logic high state and the fifth and sixth control signals at logic high state. Thus, the third and fourth filter taps 210c and 210d latch corresponding input signals and generate third and fourth tapped signals, respectively. The first and second multipliers 206a and 206b multiply the third and fourth tapped signals with the second coefficient value and the fourth coefficient value, respectively, thereby generating a weighted third tapped signal and a weighted fourth tapped signal as the first and second multiplier output signals, respectively. The third adder 204c adds the first and second multiplier output signals for generating the third adder signal. The first accumulator 208 accumulates the third adder signal generated by the third adder 204c during the time period T0-T6. As the first control circuit 104a generates the ninth control signal such that the value corresponding to the ninth control signal is one during the time period T4-T6, the thirteenth mux 202m outputs the second accumulator signal as the fourth output signal.

Thus, the first segment cell 102a outputs at a frequency that is half times the input operating frequency thereof.

Figures 6, 7:
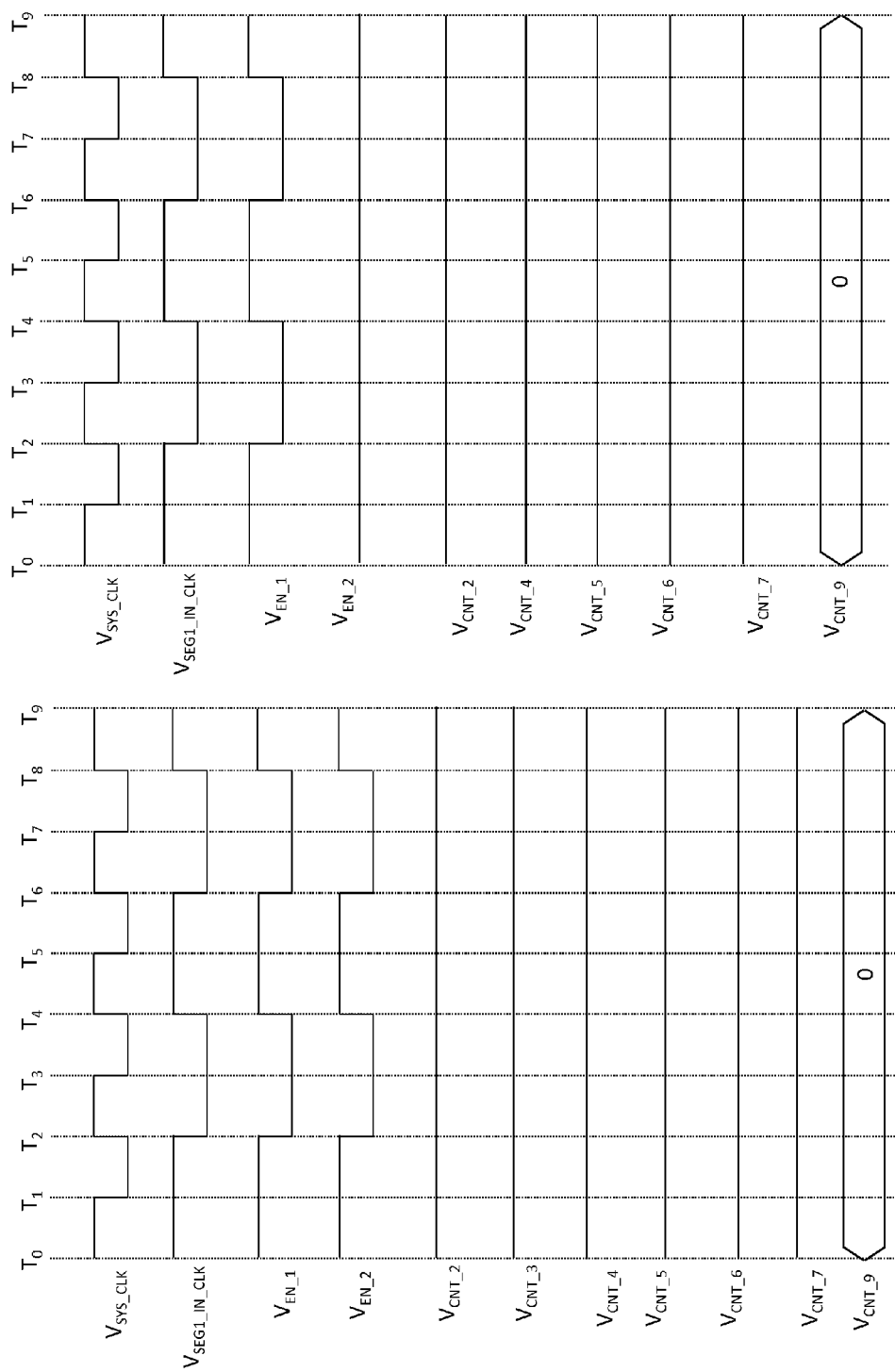
FIG. 6 is a timing diagram illustrating the control signals when the first segment cell is configured as a symmetric filter in accordance with an embodiment of the present invention.
FIG. 7 is a timing diagram illustrating the control signals when the first segment cell is configured as an asymmetric filter in accordance with an embodiment of the present invention.

Referring now to FIG. 6, a timing diagram illustrating the control signals when the first segment cell 102a is configured as a symmetric filter in accordance with an embodiment of the present invention is shown. In an example, the values corresponding to the first control signal, the second control signal, the third control signal, the fourth control signal, the seventh control signal, and the ninth control signal are zero, one, one, one, one, and zero, respectively. The first ratio is 2 and the second ratio is 2. Thus, the input and output operating frequencies of the first segment cell 102a are half times the system clock frequency.

The first control circuit 104a generates the first and second enable signals at a frequency that is half times the system clock frequency. Thus, the first through fourth filters taps 210a-210d latch values of corresponding input signals for a time period corresponding to the input operating frequency of the first segment cell 102a. The first control circuit 104a generates the first, second, third, fourth, seventh, and ninth control signals at logic low state, logic high state, logic high state, logic high state, logic high state, and logic low state, respectively. The first control circuit 104a generates the fifth and sixth control signals at logic low state.

During time period T0-T2, the first control circuit 104a generates the first and second enable signals at logic high state. The first through fourth filter taps 210a-210d generate the first through fourth tapped signals, respectively. The first and second multipliers 206a and 206b multiply the first and second adder signals with the first and third coefficient values for generating a weighted first adder signal and a weighted second adder signal as the first multiplier output signal and the second multiplier output signal, respectively. The third adder 204c adds the first and second multiplier output signals for generating the third adder signal. As the value corresponding to the ninth control signal is zero, the thirteenth mux 202m outputs the third adder signal as the fourth output signal.

During time period T2-T4, the first control circuit 104a generates the first and second enable signals at logic low state and hence, the first through fourth filter taps 210a-210d are disabled.

Referring now to FIG. 7, a timing diagram illustrating the control signals when the first segment cell 102a is configured as an asymmetric filter in accordance with an embodiment of the present invention is shown. In an example, the values corresponding to the first control signal, the second control signal, the fourth control signal, the seventh control signal, and the ninth control signal are zero, one, zero, one, and zero, respectively. The first ratio is 2 and the second ratio is 2. Thus, the input and output operating frequencies of the first segment cell 102a are half times the system clock frequency.

The first control circuit 104a generates the first enable signal at a frequency that is half times the system clock frequency. Thus, the first and second filters taps 210a and 210b latch values of corresponding input signals for a time period corresponding to the input operating frequency of the first segment cell 102a. The first control circuit 104a the first, second, fourth, seventh, and ninth control signals at logic low state, logic high state, logic low state, logic high state, and logic low state, respectively. The first control circuit 104a generates the second enable signal and the fifth and sixth control signals at logic low state.

During time period T0-T2, the first control circuit 104a generates the first enable signal at logic high state. The first and second filter taps 210a and 210b generate the first and second tapped signals, respectively. The first and second multipliers 206a and 206b multiply the first and second tapped signals with the first and third coefficient values for generating a weighted first tapped signal and a weighted second tapped signal as the first multiplier output signal and the second multiplier output signal, respectively. The third adder 204c adds the first and second multiplier output signals for generating the third adder signal. As the value corresponding to the ninth control signal is zero, the thirteenth mux 202m outputs the third adder signal as the fourth output signal.

During time period T2-T4, the first control circuit 104a generates the first enable signal at logic low state and hence, the first and second filter taps 210a and 210b are disabled.

Thus, the first and second adder 204a and 204b pre-add the respective input signals, thereby reducing the number of multipliers required when the first segment cell 102a is configured as a symmetric filter.

Figure 8:
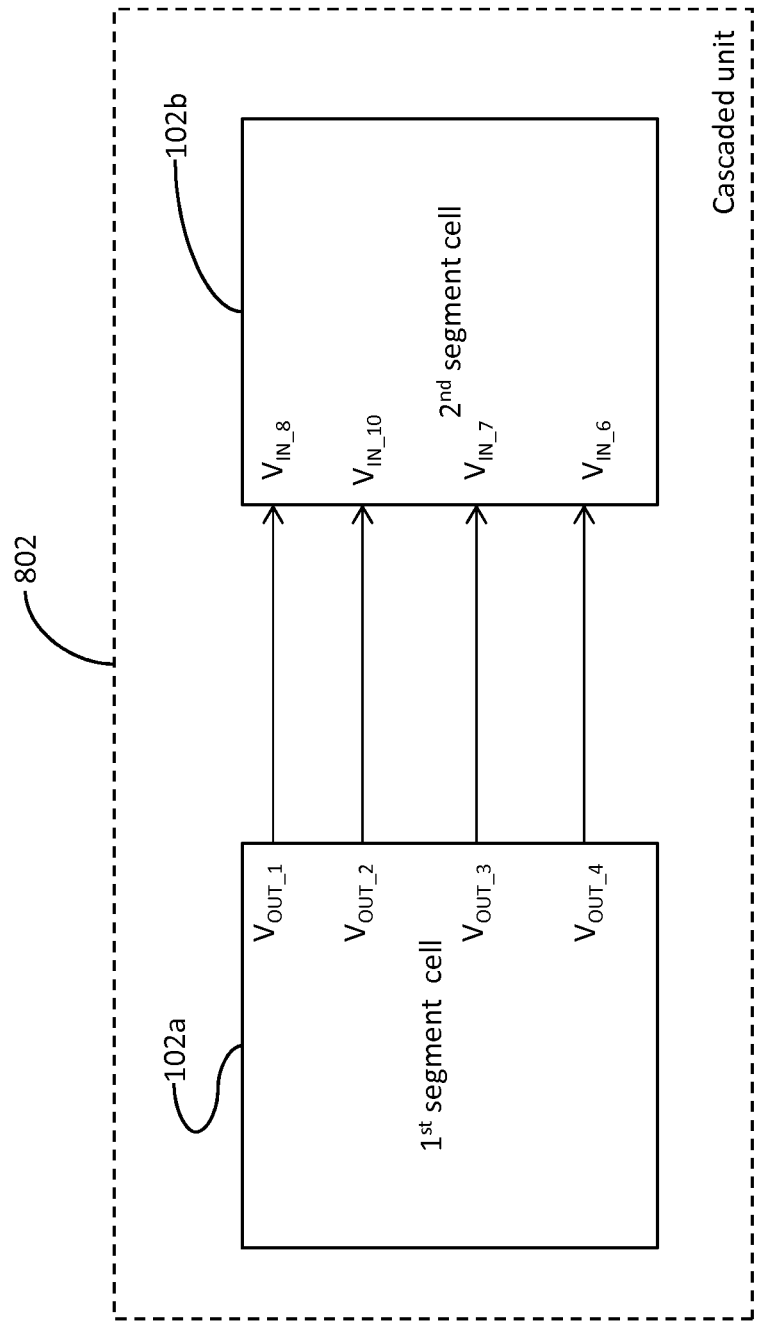
FIG. 8 is a schematic block diagram of a cascaded unit formed by cascading the first and second segment cells in accordance with an embodiment of the present invention.

Referring now to FIG. 8, a schematic block diagram of a cascaded unit 802 in accordance with an embodiment of the present invention is shown. The cascaded unit 802 is formed by cascading the first and second segment cells 102a and 102b. The second segment cell 102b receives the first, second, third, and fourth output signals as the eighth, tenth, seventh, and sixth input signals, respectively.

A user can configure the cascaded unit 802 as at least one of an interpolation filter, a decimation filter, a symmetric filter, an asymmetric filter, a complex symmetric filter, and a complex asymmetric filter by providing the first and second sets of values. Thus, the first control circuit 104a generates the first control signal, the second control signal, the third control signal, the fourth control signal, the seventh control signal, and the eighth control signal based on the first set of values and the second control circuit 104b generates the tenth control signal, the eleventh control signal, the twelfth control signal, the thirteenth control signal, the sixteenth control signal, and the seventeenth control signal based on the second set of values. The user further provides the first ratio, the second ratio, a third ratio, and a fourth ratio. The third ratio is the ratio of the system clock frequency to the input operating frequency of the second segment cell 102b. The fourth ratio is the ratio of the system clock frequency to the output operating frequency of the second segment cell 102b. The first control circuit 104a generates the first and second enable signals and the fifth and sixth control signals based on the first and second ratios. The second control circuit 104b generates the third and fourth enable signals and the fourteenth and fifteenth control signals based on the third and fourth ratios. In an embodiment, the user provides values indicative of the ninth control signal and the eighteenth control signal when the cascaded unit 802 is configured as at least one of an interpolation filter, a symmetric filter, and an asymmetric filter. In another embodiment, the first control circuit 104a generates the ninth control signal based on at least one of the first set of values and the first and second ratios, and the second control circuit 104b generates the eighteenth control signal based on the second set of values and the third and fourth ratios.

Figure 9B:
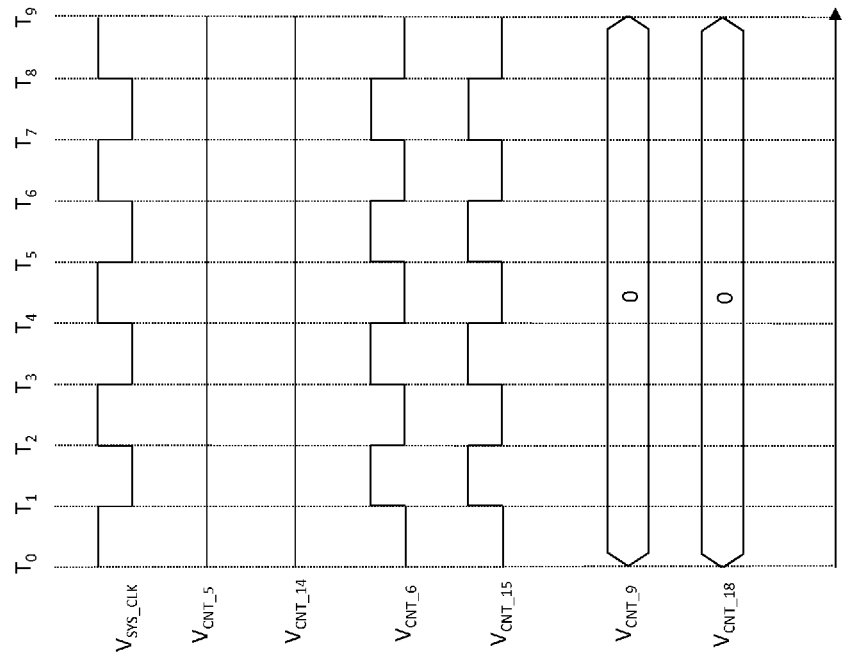
FIGS. 9A and 9B are a timing diagram illustrating the control signals when the cascaded unit is configured as an interpolation filter in accordance with an embodiment of the present invention.
Figure 9A:
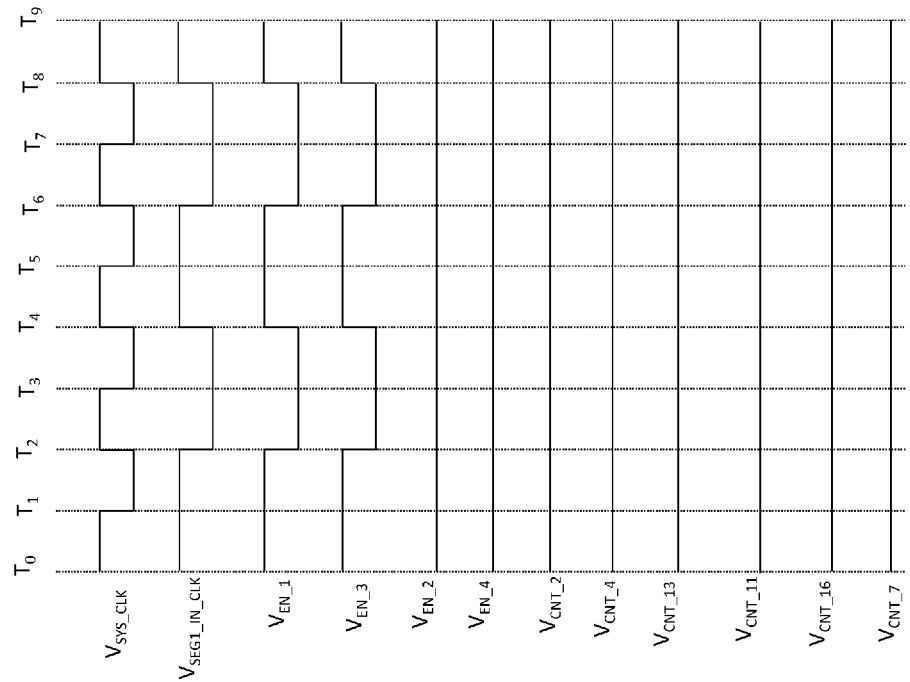

Referring now to FIGS. 9A and 9B, a timing diagram illustrating the control signals when the cascaded unit 802 is configured as an interpolation filter in accordance with an embodiment of the present invention is shown. In an example, the values corresponding to the first control signal, the second control signal, the fourth control signal, the seventh control signal, and the ninth control signal in the first set of values are zero, one, zero, one, and zero, respectively. The values corresponding to the eleventh control signal, the thirteenth control signal, the sixteenth control signal, and the eighteenth control signal in the second set of values are zero. The first and third ratios are 2 and the second and fourth ratios are 1. Thus, the input operating frequencies of the first and second segment cells 102a and 102b are half times the system clock frequency. The output operating frequencies of the first and second segment cells 102a and 102b are equal to the system clock frequency. Hence, the interpolation factor is 2. The first control circuit 104a generates the first, second, fourth, seventh, and ninth control signals at logic low state, logic high state, logic low state, logic high state, and logic low state, respectively. The first control circuit 104a generates the second enable signal and the fifth control signal at logic low state. The second control circuit 104b generates the eleventh, thirteenth, sixteenth, and eighteenth control signals at logic low state. The second control circuit 104b generates the fourth enable signal and the fourteenth control signal at logic low state.

The first and second control circuits 104a and 104b generate the first and third enable signals, respectively, at a frequency that is half times the system clock frequency. Thus, the first and second filter taps 210a and 210b and the fifth and sixth filter taps 310a and 310b latch values of corresponding input signals at the frequency that is half times the system clock frequency for generating the first, second, fifth, and sixth tapped signals, respectively. As the interpolation factor is 2, the first and second control circuits 104a and 104b generate the sixth and fifteenth control signals, respectively, at a frequency that is equal to the system clock frequency.

During time period T0-T1, the first and second control circuits 104a and 104b generate the sixth and fifteenth control signals at logic low state, respectively. Thus, the first and second multipliers 206a and 206b multiply the first and second tapped signals with the first and third coefficient values, respectively, thereby generating a weighted first tapped signal and a weighted second tapped signal as the first and second multiplier output signals, respectively. The third and fourth multipliers 306a and 306b multiply the fifth and sixth tapped signals with the fifth and seventh coefficient values, respectively, thereby generating a weighted fifth tapped signal and a weighted sixth tapped signal as the third and fourth multiplier output signals, respectively. The third adder 204c adds the first and second multiplier output signals for generating the third adder signal. The thirteenth mux 202m outputs the third adder signal as the fourth output signal. The seventh adder 304c adds the fourth output signal, the third and fourth multiplier output signals for generating the seventh adder signal. The twenty-sixth mux 302m outputs the seventh adder signal as the eighth output signal.

During time period T1-T2, as the first control circuit 104a generates the sixth control signal at logic high state, the first and second multipliers 206a and 206b multiply the first and second tapped signals with the second and fourth coefficient values, respectively, thereby generating a weighted first tapped signal and a weighted second tapped signal as the first and second multiplier output signals, respectively. As the second control circuit 104b generates the fifteenth control signal at logic high state, the third and fourth multipliers 306a and 306b multiply the fifth and sixth tapped signals with the sixth and eighth coefficient values, respectively, thereby generating a weighted fifth tapped signal and a weighted sixth tapped signal as the third and fourth multiplier output signals, respectively. The third adder 204c adds the first and second multiplier output signals for generating the third adder signal. The thirteenth mux 202m outputs the third adder signal as the fourth output signal. The seventh adder 304c adds the fourth output signal, the third and fourth multiplier output signals for generating the seventh adder signal. The twenty-sixth mux 302m outputs the seventh adder signal as the eighth output signal.

Thus, the cascaded unit 802 outputs at a frequency that is twice the input operating frequency of the first segment cell 102a, i.e., at a frequency equal to the system clock frequency.

Figure 10A:
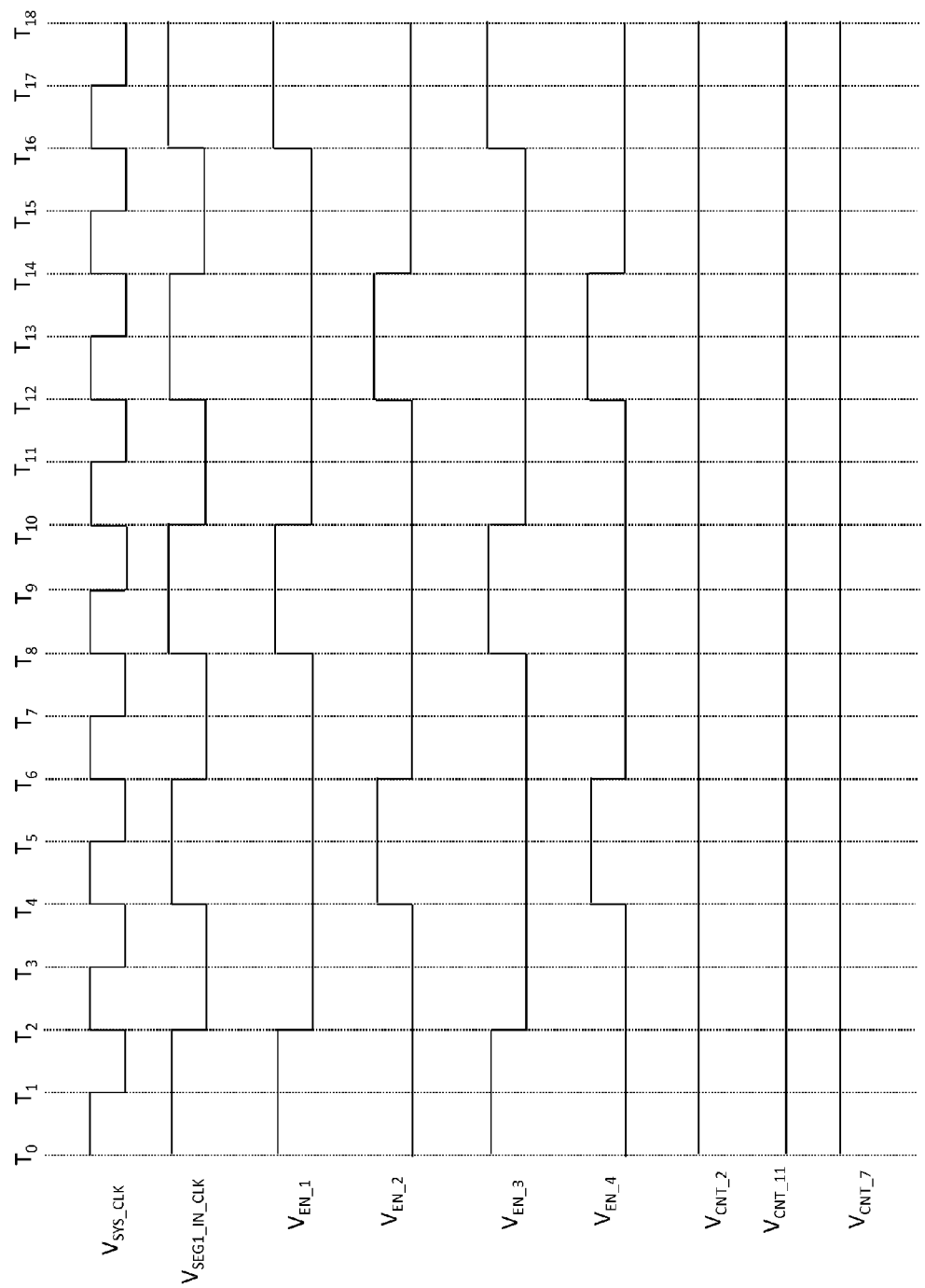
FIGS. 10A and 10B are a timing diagram illustrating the control signals when the cascaded unit is configured as a decimation filter in accordance with an embodiment of the present invention.
Figure 10B:
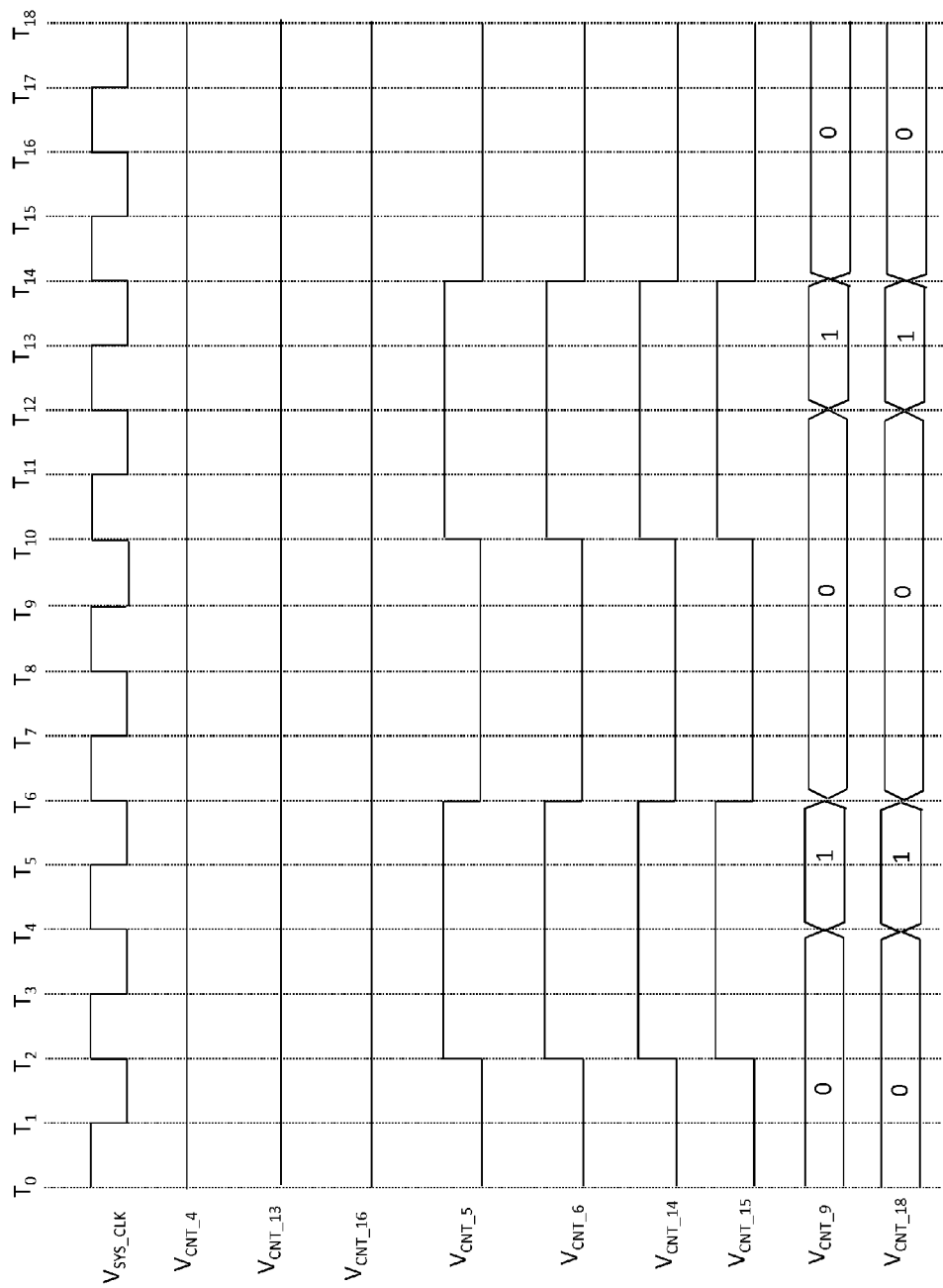

Referring now to FIGS. 10A and 10B, a timing diagram illustrating the control signals when the cascaded unit 802 is configured as a decimation filter in accordance with an embodiment of the present invention is shown. In an example, the values corresponding to the first control signal, the second control signal, the fourth control signal, and the seventh control signal are zero, one, zero, and one, respectively. The values corresponding to the eleventh control signal, the thirteenth control signal, and the sixteenth control signal are zero. In the example, the first and third ratios are 2 and the second and fourth ratios are 4. Thus, the input operating frequencies of the first and second segment cells 102a and 102b are half times the system clock frequency. The output operating frequencies of the first and second segment cells 102a and 102b are one fourth times the system clock frequency. Hence, the decimation factor is 2.

The first control circuit 104a generates the first and second enable signals at a frequency that is half times the input operating frequency of the first segment cell 102a. The second control circuit 104b generates the third and fourth enable signals at a frequency that is half times the input operating frequency of the second segment cell 102b. Thus, the first through fourth filter taps 210a-210d latch values of corresponding input signals for a time period corresponding to a frequency that is half times the input operating frequency of the first segment cell 102a and the fifth through eighth filter taps 310a-310d latch values of corresponding input signals for a time period corresponding to a frequency that is half times the input operating frequency of the second segment cell 102b. The first control circuit 104a generates the first control signal, the second control signal, the fourth control signal, and the seventh control signal at logic low state, logic high state, logic low state, and logic high state, respectively. The second control circuit 104b generates the eleventh control signal, the thirteenth control signal, and the sixteenth control signal at logic low state.

During time period T0-T2, the first control circuit 104a generates the first enable signal at logic high state and the fifth and sixth control signals at logic low state. Thus, the first and second filter taps 210a and 210b latch corresponding input signals and generate the first and second tapped signals, respectively. The second control circuit 104b generates the third enable signal at logic high state and the fourteenth and fifteenth control signals at logic low state. Thus, the fifth and sixth filter taps 310a and 310b latch corresponding input signals and generate the fifth and sixth tapped signals, respectively. The first and second multipliers 206a and 206b multiply the first and second tapped signals with the first coefficient value and the third coefficient value, respectively, thereby generating a weighted first tapped signal and a weighted second tapped signal as the first and second multiplier output signals, respectively. The third and fourth multipliers 306a and 306b multiply the fifth and sixth tapped signals with the fifth coefficient value and the seventh coefficient value, respectively, thereby generating a weighted fifth tapped signal and a weighted sixth tapped signal as the third and fourth multiplier output signals, respectively. The third adder 204c adds the first and second multiplier output signals for generating the third adder signal. The seventh adder 304c adds the fourth output signal, and the third and fourth multiplier output signals for generating the seventh adder signal.

During time period T2-T4, the first control circuit 104a generates the first and second enable signals at logic low state. Hence, the first through fourth filter taps 210a-210d are disabled. The second control circuit 104b generates the third and fourth enable signals at logic low state. Hence, the fifth through eighth filter taps 310a-310d are disabled.

During time period T4-T6, the first control circuit 104a generates the second enable signal at logic high state and the fifth and sixth control signals at logic high state. Thus, the third and fourth filter taps 210c and 210d latch corresponding input signals and generate the third and fourth tapped signals, respectively. The second control circuit 104b generates the fourth enable signal at logic high state and the fourteenth and fifteenth control signals at logic high state. Thus, the seventh and eighth filter taps 310c and 310d latch corresponding input signals and generate the seventh and eighth tapped signals, respectively. The first and second multipliers 206a and 206b multiply the third and fourth tapped signals with the second coefficient value and the fourth coefficient value, respectively, thereby generating a weighted third tapped signal and a weighted fourth tapped signal as the first and second multiplier output signals, respectively. The third and fourth multipliers 306a and 306b multiply the seventh and eighth tapped signals with the sixth coefficient value and the eighth coefficient value, respectively, thereby generating a weighted seventh tapped signal and a weighted eighth tapped signal as the third and fourth multiplier output signals, respectively. The third adder 204c adds the first and second multiplier output signals for generating the third adder signal. The seventh adder 304c adds the fourth output signal and the third and fourth multiplier output signals for generating the seventh adder signal. The first accumulator 208 accumulates the third adder signal generated by the third adder 204c during the time period T0-T6. The second accumulator 308 accumulates the seventh adder signal generated by the seventh adder 304c during the time period T0-T6. As the first control circuit 104a generates the ninth control signal such that the value of the ninth control signal is one during the time period T4-T6, the thirteenth mux 202m outputs the first accumulator signal as the fourth output signal. As the second control circuit 104b generates the eighteenth control signal such that the value of the eighteenth control signal is one during the time period T4-T6, the twenty-sixth mux 302m outputs the second accumulator signal as the eighth output signal.

Thus, the cascaded unit 802 outputs at a frequency that is half times the input operating frequency of the first segment cell 102a.

Figures 11A, 11B:
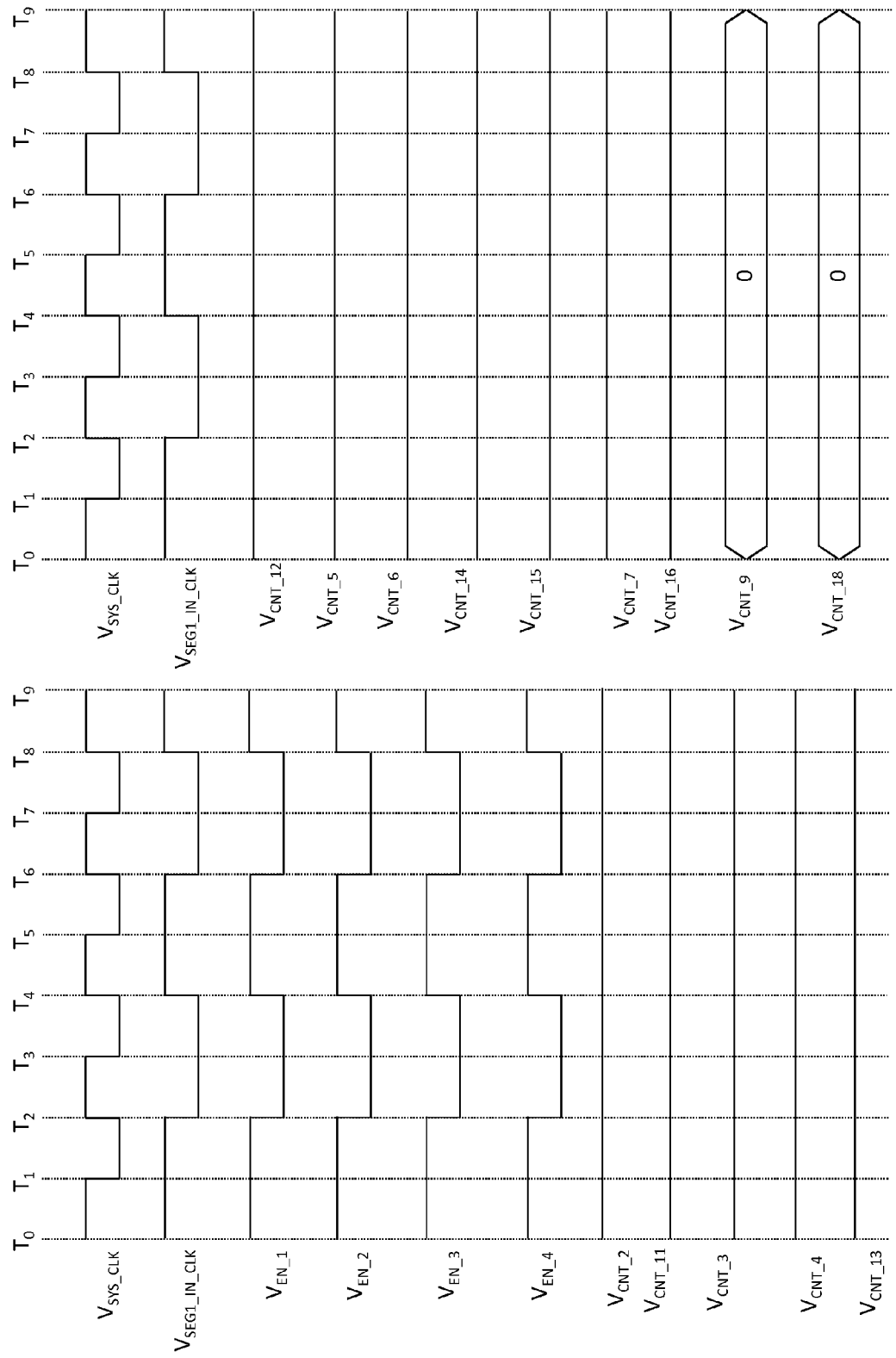
FIGS. 11A and 11B are a timing diagram illustrating the control signals when the cascaded unit is configured as a symmetric filter in accordance with an embodiment of the present invention.

Referring now to FIGS. 11A and 11B, a timing diagram illustrating the control signals when the cascaded unit 802 is configured as a symmetric filter in accordance with an embodiment of the present invention is shown. In an example, the values corresponding to the first control signal, the second control signal, the third control signal, the fourth control signal, the seventh control signal, and the ninth control signal are zero, one, zero, one, one, and zero, respectively. The values corresponding to the eleventh, twelfth, thirteenth, sixteenth, and eighteenth control signals are zero, one, one, zero, and zero, respectively. The first, second, third, and fourth ratios are 2. Thus, the input and output operating frequencies of the first and second segment cells 102a and 102b are half times the system clock frequency. The first segment cell 104a receives the sixth output signal as the fourth input signal.

The first control circuit 104a generates the first and second enable signals at a frequency that is half times the system clock frequency. Thus, the first through fourth filters taps 210a-210d latch values of corresponding input signals for a time period corresponding to a frequency that is half times the system clock frequency. The second control circuit 104b generates the third and fourth enable signals at a frequency that is half times the system clock frequency. Thus, the fifth through eighth filters taps 310a-310d latch values of corresponding input signals for a time period corresponding to a frequency that is half times the system clock frequency. The first control circuit 104a generates the first, second, third, fourth, seventh, and ninth control signals at logic low state, logic high state, logic low state, logic high state, logic high state, and logic low state, respectively. The first control circuit 104a generates the fifth and sixth control signals at logic low state. The second control circuit 104b generates the eleventh, twelfth, thirteenth, sixteenth, and eighteenth control signals at logic low state, logic high state, logic high state, logic low state, and logic low state, respectively. The second control circuit 104b generates the fourteenth and fifteenth control signals at logic low state.

During time period T0-T2, the first control circuit 104a generates the first and second enable signals at logic high state. The first through fourth filter taps 210a-210d generate the first through fourth tapped signals, respectively. The second control circuit 104b generates the third and fourth enable signals at logic high state. The fifth through eighth filter taps 310a-310d generate the fifth through eighth tapped signals, respectively. The first and second multipliers 206a and 206b multiply the first and second adder signals with the first and third coefficient values for generating a weighted first adder signal and a weighted second adder signal as the first multiplier output signal and the second multiplier output signal, respectively. The third and fourth multipliers 306a and 306b multiply the fifth and sixth adder signals with the fifth and seventh coefficient values for generating a weighted fifth adder signal and a weighted sixth adder signal as the third multiplier output signal and the fourth multiplier output signal, respectively. The third adder 204c adds the first and second multiplier output signals for generating the third adder signal. As the value corresponding to the ninth control signal is zero, the thirteenth mux 202m outputs the third adder signal as the fourth output signal. The seventh adder 304c adds the fourth output signal, the third and fourth multiplier output signals for generating the seventh adder signal. As the value corresponding to the eighteenth control signal is zero, the twenty-sixth mux 302m outputs the seventh adder signal as the eighth output signal.

During time period T2-T4, the first control circuit 104a generates the first and second enable signals at logic low state and hence, the first through fourth filter taps 210a-210d are disabled. The second control circuit 104b generates the third and fourth enable signals at logic low state and hence, the fifth through eighth filter taps 310a-310d are disabled.

Figures 12A, 12B:
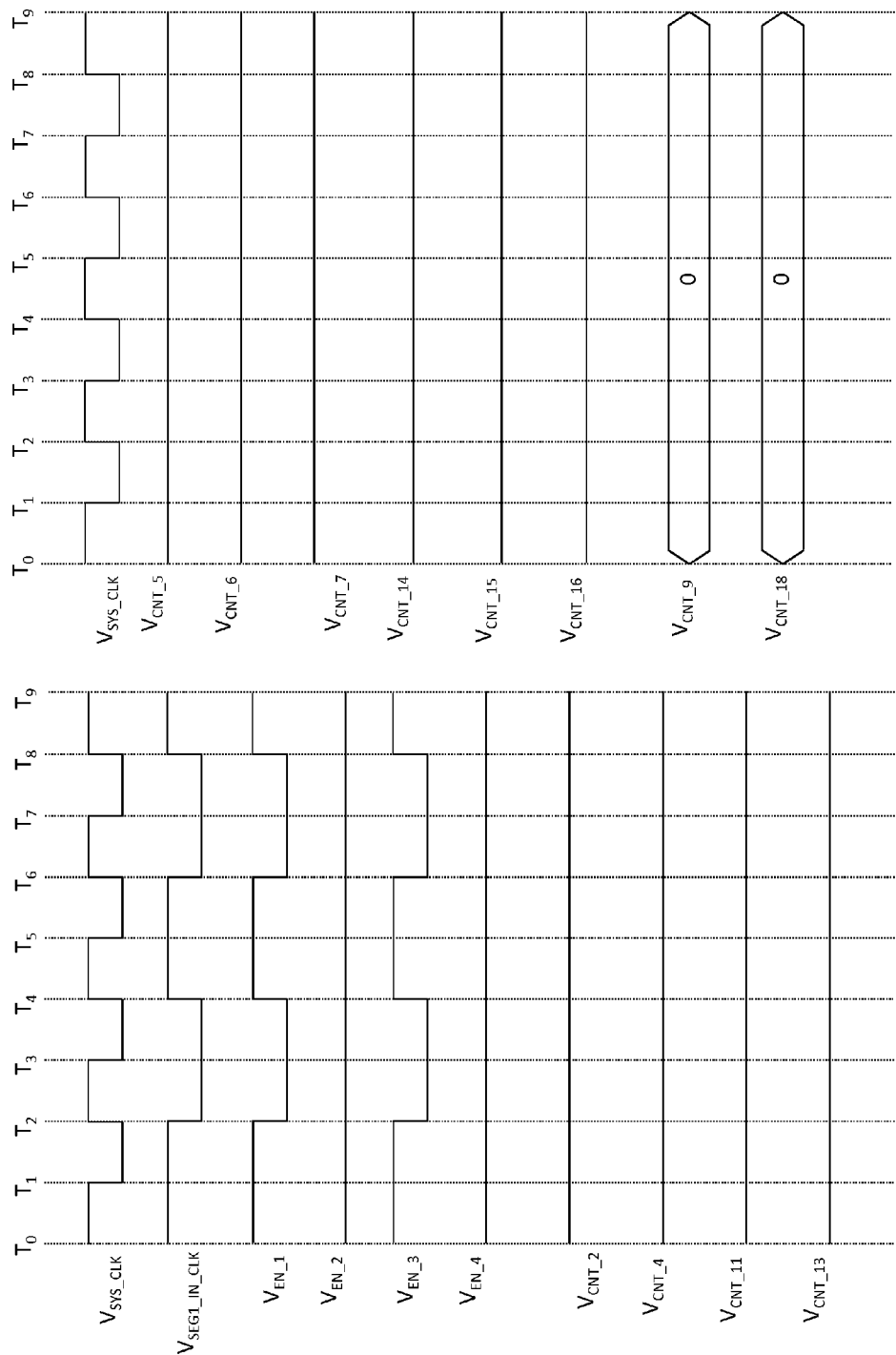
FIGS. 12A and 12B are a timing diagram illustrating the control signals when the cascaded unit is configured as an asymmetric filter in accordance with an embodiment of the present invention.

Referring now to FIGS. 12A and 12B, a timing diagram illustrating the control signals when the cascaded unit 802 is configured as an asymmetric filter in accordance with an embodiment of the present invention is shown. In an example, the values corresponding to the first control signal, the second control signal, the fourth control signal, the seventh control signal, and the ninth control signal are zero, one, zero, one, and zero, respectively. The values corresponding to the eleventh, thirteenth, sixteenth, and eighteenth control signals are zero. The first, second, third, and fourth ratios are 2. Thus, the input and output operating frequencies of the first and second segment cells 102*a* and 102*b* are half times the system clock frequency.

The first control circuit 104*a* generates the first enable signal at a frequency that is half times the system clock frequency. Thus, the first and second filters taps 210*a* and 210*b* latch values of corresponding input signals for a time period corresponding to a frequency that is half times the system clock frequency. The second control circuit 104*b* generates the third enable signal at a frequency that is half times the system clock frequency. Thus, the fifth and sixth filters taps 310*a* and 310*b* latch values of corresponding input signals for a time period corresponding to a frequency that is half times the system clock frequency. The first control circuit 104*a* the first, second, fourth, seventh, and ninth control signals at logic low state, logic high state, logic low state, logic high state, and logic low state, respectively. The second control circuit 104*b* generates the eleventh, thirteenth, sixteenth, and eighteenth control signals at logic low state. The first control circuit 104*a* generates the second enable signal and the fifth and sixth control signals at logic low state. The second control circuit 104*b* generates the fourth enable signal and the fourteenth and fifteenth control signals at logic low state.

During time period T0-T2, the first control circuit 104*a* generates the first enable signal at logic high state. The first and second filter taps 210*a* and 210*b* generate the first and second tapped signals, respectively. The second control circuit 104*b* generates the third enable signal at logic high state. The fifth and sixth filter taps 310*a* and 310*b* generate the fifth and sixth tapped signals, respectively. The first and second multipliers 206*a* and 206*b* multiply the first and second tapped signals with the first and third coefficient values for generating a weighted first tapped signal and a weighted second tapped signal as the first multiplier output signal and the second multiplier output signal, respectively. The third and fourth multipliers 306*a* and 306*b* multiply the fifth and sixth tapped signals with the fifth and seventh coefficient values for generating a weighted fifth tapped signal and a weighted sixth tapped signal as the third multiplier output signal and the fourth multiplier output signal, respectively. The third adder 204*c* adds the first and second multiplier output signals for generating the third adder signal. As the value corresponding to the ninth control signal is zero, the thirteenth mux 202*m* outputs the third adder signal as the fourth output signal. The seventh adder 304*c* adds the fourth output signal and the third and fourth multiplier output signals for generating the seventh adder signal. As the value corresponding to the eighteenth control signal is zero, the twenty-sixth mux 302*m* outputs the seventh adder signal as the eighth output signal.

During time period T2-T4, the first control circuit 104*a* generates the first enable signal at logic low state and hence, the first and second filter taps 210*a* and 210*b* are disabled. The second control circuit 104*b* generates the third enable signal at logic low state and hence, the fifth and sixth filter taps 310*a* and 310*b* are disabled.

Referring now to FIGS. 13A and 13B, a timing diagram illustrating the control signals when the cascaded unit 802 is configured as a complex symmetric filter in accordance with an embodiment of the present invention is shown. In an example, the values corresponding to the first control signal, the second control signal, the third control signal, the fourth control signal, the seventh control signal, the eighth control signal, and the ninth control signal are zero, one, one, one, one, zero, and zero, respectively. The values corresponding to the tenth, eleventh, twelfth, thirteenth, sixteenth, seventeenth, and eighteenth control signals are one, one, one, one, one, zero, and two, respectively. The first, second, third, and fourth ratios are 2. Thus, the input and output operating frequencies of the first and second segment cells 102*a* and 102*b* are half times the system clock frequency.

The first control circuit 104*a* generates the first and second enable signals at a frequency that is half times the system clock frequency. Thus, the first through fourth filters taps 210*a*-210*d* latch values of corresponding input signals for a time period corresponding to a frequency that is half times the system clock frequency. The second control circuit 104*b* generates the third and fourth enable signals at a frequency that is half times the system clock frequency. Thus, the fifth through eighth filters taps 310*a*-310*d* latch values of corresponding input signals for a time period corresponding to a frequency that is half times the system clock frequency. The first control circuit 104*a* generates the first, second, third, fourth, seventh, eighth, and ninth control signals at logic low state, logic high state, logic high state, logic high state, logic high state, logic low state, and logic low state, respectively. The first control circuit 104*a* generates the fifth and sixth control signals at logic low state. The second control circuit 104*b* generates the tenth, eleventh, twelfth, thirteenth, sixteenth, and seventeenth control signals at logic high state, logic high state, logic high state, logic high state, logic high state, and logic low state, respectively. The second control circuit 104*b* generates the eighteenth control signal such that the value corresponding to the eighteenth control signal is two. The second control circuit 104*b* generates the fourteenth and fifteenth control signals at logic low state.

From time T0-T2, the first control circuit 104*a* generates the first and second enable signals at logic high state. The first through fourth filter taps 210*a*-210*d* generate the first through fourth tapped signals, respectively. The second control circuit 104*b* generates the third and fourth enable signals at logic high state. The fifth through eighth filter taps 310*a*-310*d* generate the fifth through eighth tapped signals, respectively. The first and second multipliers 206*a* and 206*b* multiply the first and second adder signals with the first and third coefficient values for generating a weighted first adder signal and a weighted second adder signal as the first multiplier output signal and the second multiplier output signal, respectively. The third and fourth multipliers 306*a* and 306*b* multiply the fifth and sixth adder signals with the fifth and seventh coefficient values for generating a weighted fifth adder signal and a weighted sixth adder signal as the third multiplier output signal and the fourth multiplier output signal, respectively. The third adder 204*c* adds the first and second multiplier output signals for generating the third adder signal. As the value corresponding to the ninth control signal is zero, the thirteenth mux 202*m* outputs the third adder signal as the fourth output signal. The seventh adder 304*c* adds the third and fourth multiplier output signals for generating the seventh adder signal. The twenty-fifth mux 302*l* outputs the sixth input signal (i.e., the fourth output signal) as the twenty-fourth intermediate signal. The eighth adder 304*d* adds the seventh adder signal and the twenty-fourth intermediate signal. As the value of the eighteenth control signal is two, the twenty-sixth mux 302*m* outputs the seventh adder signal as the eighth output signal.

From time T2-T4, the first control circuit 104*a* generates the first and second enable signals at logic low state and hence, the first through fourth filter taps 210*a*-210*d* are disabled. The second control circuit 104*b* generates the third and fourth enable signals at logic low state and hence, the fifth through eighth filter taps 310*a*-310*d* are disabled.

Referring now to FIGS. 14A and 14B, a timing diagram illustrating the control signals when the cascaded unit 802 is configured as a complex asymmetric filter in accordance with an embodiment of the present invention is shown. In an example, the values corresponding to the first control signal, the second control signal, the fourth control signal, the seventh control signal, the eighth control signal, and the ninth control signal are zero, one, zero, one, zero, and zero, respectively. The values corresponding to the tenth, eleventh, thirteenth, sixteenth, seventeenth, and eighteenth control signals are one, one, zero, one, zero, and two, respectively. The first, second, third, and fourth ratios are 2. Thus, the input and output operating frequencies of the first and second segment cells 102a and 102b are half times the system clock frequency.

The first control circuit 104a generates the first enable signal at a frequency that is half times the system clock frequency. Thus, the first and second filter taps 210a and 210b latch values of corresponding input signals for a time period corresponding to a frequency that is half times the system clock frequency. The second control circuit 104b generates the third enable signal at a frequency that is half times the system clock frequency. Thus, the fifth and sixth filters taps 310a and 310b latch values of corresponding input signals for a time period corresponding to a frequency that is half times the system clock frequency. The first control circuit 104a generates the first, second, fourth, seventh, eighth, and ninth control signals at logic low state, logic high state, logic low state, logic high state, logic low state, and logic low state, respectively. The first control circuit 104a generates the fifth and sixth control signals at logic low state. The second control circuit 104b generates the tenth, eleventh, thirteenth, sixteenth, and seventeenth control signals at logic high state, logic high state, logic low state, logic high state, and logic low state, respectively. The second control circuit 104b generates the eighteenth control signal such that the value corresponding to the eighteenth control signal is two. The second control circuit 104b generates the fourteenth and fifteenth control signals at logic low state.

From time T0-T2, the first control circuit 104a generates the first enable signal at logic high state. The first and second filter taps 210a and 210b generate the first and second tapped signals, respectively. The second control circuit 104b generates the third enable signal at logic high state. The fifth and sixth filter taps 310a and 310b generate the fifth and sixth tapped signals, respectively. The first and second multipliers 206a and 206b multiply the first and second tapped signals with the first and third coefficient values for generating a weighted first tapped signal and a weighted second tapped signal as the first multiplier output signal and the second multiplier output signal, respectively. The third and fourth multipliers 306a and 306b multiply the fifth and sixth tapped signals with the fifth and seventh coefficient values for generating a weighted fifth tapped signal and a weighted sixth tapped signal as the third multiplier output signal and the fourth multiplier output signal, respectively. The third adder 204c adds the first and second multiplier output signals for generating the third adder signal. As the value corresponding to the ninth control signal is zero, the thirteenth mux 202m outputs the third adder signal as the fourth output signal. The seventh adder 304c adds the third and fourth multiplier output signals for generating the seventh adder signal. The twenty-fifth mux 302l outputs the sixth input signal (i.e., the fourth output signal) as the twenty-fourth intermediate signal. The eighth adder 304d adds the seventh adder signal and the twenty-fourth intermediate signal. As the value of the eighteenth control signal is two, the twenty-sixth mux 302m outputs the seventh adder signal as the eighth output signal.

From time T2-T4, the first control circuit 104a generates the first enable signal at logic low state and hence, the first and second filter taps 210a and 210b are disabled. The second control circuit 104b generates the third enable signal at logic low state and hence, the fifth and sixth filter taps 310a and 310b are disabled.

Thus, the first adder 204a, the second adder 204b, the fifth adder 304a, and the sixth adder 304b pre-add the respective input signals, thereby reducing the number of multipliers required when the cascaded unit 802 is configured as at least one of a symmetric filter and a complex symmetric filter.

The FIR filter circuit 100 can be designed to have any number of segment cells. Each delay line in the segment cells 102 can include any number of filter taps. The segment cells 102 can be designed to have any number of delay cells in the delay lines. The number of delay lines in the segment cells 102 can be varied based on the maximum decimation factor requirement. The FIR filter circuit 100 can be configured to achieve any interpolation factor. In an example, the ninth and tenth muxes 202i and 202j are 4:1 muxes for achieving an interpolation factor of 4. As the segment cells 102 make use of pre-adders, the number of multipliers required is decreased, thereby reducing area requirement. Further, the two or more segment cells among the segment cells 102 can be configured as at least one of an interpolation filter, a decimation filter, a symmetric filter, an asymmetric filter, a complex symmetric filter, and a complex asymmetric filter. Thus, the FIR filter circuit 100 can be configured as a filter with real-valued coefficients. The FIR filter circuit 100 can even be configured as a filter with complex-valued coefficients. Further, the coefficient values and the first and second set of values can be changed during run-time, thereby providing run-time configurability.

It will be understood by those of skill in the art that a segment cell or more than one segment cell among the segment cells 102 can be configured to achieve a rational interpolation factor or a rational decimation factor.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention. No element, act, or instruction used in the present application should be construed as critical or essential to the invention unless explicitly described as such. Further, the phrase "based on" is intended to mean "based, at least in part, on" unless explicitly stated otherwise.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A finite impulse response (FIR) filter, comprising:
a plurality of segment cells, wherein each segment cell is configurable as at least one of an interpolation filter, a decimation filter, a symmetric filter, and an asymmetric filter, and wherein two or more of the segment cells are configurable to cascaded to form at least one of an interpolation filter, a decimation filter, a symmetric filter, an asymmetric filter, a complex symmetric filter, and a complex asymmetric filter, and wherein a first segment cell of the plurality of segment cells outputs first, second, third, and fourth output signals, and wherein the first segment cell comprises:

a first multiplexer that receives first and second input signals and a first control signal, and outputs a first intermediate signal;

a second multiplexer that receives a third input signal and the first intermediate output signal, and a second control signal, and outputs a second intermediate signal;

a first tapped delay line connected to the second multiplexer for receiving the second intermediate signal, wherein the first tapped delay line includes first and second filter taps and generates first and second tapped signals, respectively, based on a first enable signal, and wherein the first segment cell outputs the second tapped signal as the first output signal;

a third multiplexer that receives a fourth input signal and the first output signal, and a third control signal, and outputs a third intermediate signal;

a fourth multiplexer that receives a fifth input signal, the first intermediate signal, and the third intermediate signal, and receives as select signals the second control signal and a fourth control signal, and outputs a fourth intermediate signal;

a second tapped delay line connected to the fourth multiplexer for receiving the fourth intermediate signal, wherein the second tapped delay line includes third and fourth filter taps and generates respective third and fourth tapped signals based on a second enable signal, and wherein the first segment cell outputs the fourth tapped signal as the second output signal;

a first adder connected to the first and second tapped delay lines for receiving the first and fourth tapped signals, respectively, and generating a first adder signal;

a second adder connected to the first and second tapped delay lines for receiving the second and third tapped signals, respectively, and generating a second adder signal;

a fifth multiplexer connected to the first tapped delay line and the first adder for receiving the first tapped signal and the first adder signal, respectively, and receiving the fourth control signal as a select input, and outputting a fifth intermediate signal;

a sixth multiplexer connected to the first tapped delay line and the second adder for receiving the second tapped signal and the second adder signal, respectively, and receiving the fourth control signal as a select input, and outputting a sixth intermediate signal;

a seventh multiplexer connected to the fifth multiplexer and the second tapped delay line for receiving the fifth intermediate signal and the third tapped signal, respectively, and receiving a fifth control signal as a select input, and outputting a seventh intermediate signal;

an eighth multiplexer connected to the sixth multiplexer and the second tapped delay line for receiving the sixth intermediate signal and the fourth tapped signal, respectively, and receiving the fifth control signal as a select input, and outputting an eighth intermediate signal;

a ninth multiplexer that receives first and second signals indicative of first and second coefficient values, respectively, and a sixth control signal as a select input, and outputs a ninth intermediate signal indicative of a first value;

a tenth multiplexer that receives third and fourth signals indicative of third and fourth coefficient values, respectively, and the sixth control signal as a select input, and outputs a tenth intermediate signal indicative of a second value;

a first multiplier that receives the seventh and ninth intermediate signals, respectively, multiplies the seventh intermediate signal with the first value, and generates a first multiplier output signal;

a second multiplier that receives the eighth and tenth intermediate signals, respectively, multiplies the eighth intermediate signal with the second value, and generates a second multiplier output signal;

an eleventh multiplexer that receives the first input signal, a tied low signal, and a seventh control signal as a select input, and outputs an eleventh intermediate signal;

a third adder connected to the first multiplier, the second multiplier, and the eleventh multiplexer for receiving the first multiplier output signal, the second multiplier output signal, and the eleventh intermediate signal, respectively, and generates a third adder signal;

a twelfth multiplexer that receives the first and second input signals, respectively, and an eighth control signal as a select input, and outputs a twelfth intermediate signal, wherein the first segment cell outputs the twelfth intermediate signal as the third output signal;

a first accumulator connected the third adder for receiving the third adder signal and generating a first accumulator signal;

a fourth adder connected to the twelfth multiplexer and the third adder for receiving the twelfth intermediate signal and the third adder signal, respectively, and generating a fourth adder signal; and a thirteenth multiplexer connected to the third adder, the first accumulator, and the fourth adder for receiving the third adder signal, the first accumulator signal, and the fourth adder signal, respectively, and receiving a multi-bit ninth control signal as a two-bit select input, and outputting the fourth output signal.

2. The FIR filter of claim 1, further comprising a first control circuit for generating a first set of signals including the first and second enable signals, and the first through ninth control signals.

3. The FIR filter of claim 2, wherein when the first segment cell is configured as an interpolation filter the first control circuit generates the first set of signals such that:

the first multiplier successively multiplies the first tapped signal with the first and second coefficient values and generates first and second weighted signals as the first multiplier output signal, the second multiplier successively multiplies the second tapped signal with the third and fourth coefficient values and generates third and fourth weighted signals as the second multiplier output signal, the third adder successively adds the first weighted signal and the third weighted signal, and the second weighted signal and the fourth weighted signal, and generates first and second intermediate adder signals as the third adder signal, and the thirteenth multiplexer successively outputs the first and second intermediate adder signals as the fourth output signal.

4. The FIR filter of claim 2, wherein when the first segment cell is configured as a decimation filter the first control circuit generates the first set of signals such that:
the first multiplier successively receives the first and third tapped signals and generates a weighted first tapped signal and a weighted third tapped signal as the first multiplier output signal,
the second multiplier successively receives the second and fourth tapped signals and generates a weighted second tapped signal and a weighted fourth tapped signal as the second multiplier output signal,
the first accumulator accumulates the weighted first through fourth tapped signals and generates the first accumulator signal, and
the thirteenth multiplexer outputs the first accumulator signal as the fourth output signal.

5. The FIR filter of claim 2, wherein when the first segment cell is configured as a symmetric filter, the first control circuit generates the first set of signals such that:
the second tapped delay line receives the first output signal as the fourth intermediate signal,
the first and second multipliers receive the first and second adder signals, respectively, and generate respective weighted first and second adder signals as the first and second multiplier output signals,
the third adder adds the first and second multiplier output signals and generates the third adder signal, and
the thirteenth multiplexer outputs the third adder signal as the fourth output signal.

6. The FIR filter of claim 2, wherein when the first segment cell is configured as an asymmetric filter, the first control circuit generates the first set of signals such that:
the first and second multipliers respectively receive the first and second tapped signals, and generate respective weighted first and second tapped signals as the first and second multiplier output signals,
the third adder adds the first and second multiplier output signals and generates the third adder signal, and
the thirteenth multiplexer outputs the third adder signal as the fourth output signal.

7. The FIR filter of claim 2, wherein a second segment cell of the plurality of segment cells outputs fifth through eighth output signals, and wherein the second segment cell comprises:
a fourteenth multiplexer that receives sixth and seventh input signals, and a tenth control signal as a select input, and outputs a thirteenth intermediate signal;
a fifteenth multiplexer that receives an eighth input signal and the thirteenth intermediate signal, and an eleventh control signal as a select input, and outputs a fourteenth intermediate signal;
a third tapped delay line that receives the fourteenth intermediate signal, wherein the third tapped delay line includes fifth and sixth filter taps for generating fifth and sixth tapped signals based on a third enable signal, respectively, and wherein the second segment cell outputs the sixth tapped signal as the fifth output signal;
a sixteenth multiplexer that receives a ninth input signal and the fifth output signal, and a twelfth control signal as a select input, an outputs a fifteenth intermediate signal;
a seventeenth multiplexer that receives a tenth input signal, the thirteenth intermediate signal, and the fifteenth intermediate signal, and the eleventh control signal and a thirteenth control signal as a two-bit select input, outputs a sixteenth intermediate signal;
a fourth tapped delay line that receives the sixteenth intermediate signal, wherein the fourth tapped delay line includes seventh and eighth filter taps for generating seventh and eighth tapped signals based on a fourth enable signal, respectively, and wherein the second segment cell outputs the eighth tapped signal as the sixth output signal;
a fifth adder connected to the third and fourth tapped delay lines for receiving the fifth and eighth tapped signals, respectively, and generating a fifth adder signal;
a sixth adder connected to the third and fourth tapped delay lines for receiving the sixth and seventh tapped signals, respectively, and generating a sixth adder signal;
an eighteenth multiplexer connected to the third tapped delay line and the fifth adder for receiving the fifth tapped signal and the fifth adder signal, respectively, and the thirteenth control signal as a select input, and outputting a seventeenth intermediate signal;
a nineteenth multiplexer connected to the third tapped delay line and the sixth adder for receiving the sixth tapped signal and the sixth adder signal, respectively, and the thirteenth control signal as a select input, and outputting an eighteenth intermediate signal;
a twentieth multiplexer connected to the eighteenth multiplexer and the fourth tapped delay line for receiving the seventeenth intermediate signal and the seventh tapped signal, respectively, and a fourteenth control signal as a select input, and outputting a nineteenth intermediate signal;
a twenty-first multiplexer connected to the nineteenth multiplexer and the fourth tapped delay line for receiving the eighteenth intermediate signal and the eighth tapped signal, respectively, and receiving the fourteenth control signal as a select input, and outputting a twentieth intermediate signal;
a twenty-second multiplexer that receives fifth and sixth signals indicative of fifth and sixth coefficient values, respectively, and a fifteenth control signal as a select input, and outputting a twenty-first intermediate signal indicative of a third value;
a twenty-third multiplexer for receiving seventh and eighth signals indicative of seventh and eighth coefficient values, respectively, and the fifteenth control signal as a select input, and outputting a twenty-second intermediate signal indicative of a fourth value;
a third multiplier connected to the twentieth multiplexer and the twenty-second multiplexer for receiving the nineteenth and twenty-first intermediate signals, respectively, multiplying the nineteenth intermediate signal with the third value, and generating a third multiplier output signal;
a fourth multiplier connected to the twenty-first multiplexer and the twenty-third multiplexer for receiving the twentieth and twenty-second intermediate signals, respectively, multiplying the twentieth intermediate signal with the fourth value, and generating a fourth multiplier output signal;
a twenty-fourth multiplexer that receives the sixth input signal, a tied low signal, and a sixteenth control signal as a select input, and outputs a twenty-third intermediate signal;
a seventh adder connected to the third multiplier, the fourth multiplier, and the twenty-fourth multiplexer for receiving the third multiplier output signal, the fourth multiplier output signal, and the twenty-third intermediate signal, respectively, and generating a seventh adder signal;
a twenty-fifth multiplexer that receives the sixth and seventh input signals, respectively, and a seventeenth control signal as a select input, and outputs a twenty-fourth intermediate signal, wherein the second segment cell outputs the twenty-fourth intermediate signal as the seventh output signal;
a second accumulator connected the seventh adder for receiving the seventh adder signal and generating a second accumulator signal;
an eighth adder connected to the twenty-fifth multiplexer and the seventh adder for receiving the twenty-fourth intermediate signal and the seventh adder signal, respectively, and generating an eighth adder signal; and
a twenty-sixth multiplexer connected to the seventh adder, the second accumulator, and the eighth adder for receiving the seventh adder signal, the second accumulator signal, and the eighth adder signal, respectively, and receiving an eighteenth control signal as a multi-bit select input, and outputting the eighth output signal.

8. The FIR filter of claim 7, further comprising a second control circuit for generating a second set of signals including the third and fourth enable signals and the tenth through eighteenth control signals.

9. The FIR filter of claim 8, wherein the first and second segment cells are cascaded to form a cascaded unit, and wherein the second segment cell receives the first, second, third, and fourth output signals as the eighth, tenth, seventh, and sixth input signals, respectively.

10. The FIR filter of claim 9, wherein when the cascaded unit is configured as an interpolation filter, the first control circuit generates the first set of signals such that:
the first multiplier successively multiplies the first tapped signal with the first and second coefficient values and generates first and second weighted signals as the first multiplier output signal,
the second multiplier successively multiplies the second tapped signal with the third and fourth coefficient values and generates third and fourth weighted signals as the second multiplier output signal,
the third adder successively adds the first and third weighted signals, and the second and fourth weighted signals, and generates first and second intermediate adder signals as the third adder signal,
the thirteenth multiplexer successively outputs the first and second intermediate adder signals as the fourth output signal, and
the second control circuit generates the second set of signals such that:
the fifteenth multiplexer outputs the first output signal as the fourteenth intermediate signal,
the third multiplier successively multiplies the fifth tapped signal with the fifth and sixth coefficient values and generates fifth and sixth weighted signals as the third multiplier output signal, respectively,
the fourth multiplier successively multiplies the sixth tapped signal with the seventh and eighth coefficient values and generates seventh and eighth weighted signals as the fourth multiplier output signal, respectively,
the seventh adder successively adds the first intermediate adder signal, the fifth weighted signal, and the seventh weighted signal, and the second intermediate adder signal, the sixth weighted signal, and the eighth weighted signal, and generates third and fourth intermediate adder signals as the seventh adder signal, respectively, and
the twenty-sixth multiplexer successively outputs the third and fourth intermediate adder signals as the eighth output signal.

11. The FIR filter of claim 9, wherein:
when the cascaded unit is configured as a decimation filter, the first control circuit generates the first set of signals such that:
the first multiplier successively receives the first and third tapped signals and generates a weighted first tapped signal and a weighted third tapped signal as the first multiplier output signal, respectively,
the second multiplier successively receives the second and fourth tapped signals and generates a weighted second tapped signal and a weighted fourth tapped signal as the second multiplier output signal, respectively,
the first accumulator accumulates the weighted first tapped signal, the weighted second tapped signal, the weighted third tapped signal, and the weighted fourth tapped signal for generating the first accumulator signal, and
the thirteenth multiplexer outputs the first accumulator signal as the fourth output signal, and
the second control circuit generates the second set of signals such that:
the fifteenth multiplexer outputs the first output signal as the fourteenth intermediate signal,
the seventeenth multiplexer outputs the second output signal as the sixteenth intermediate signal,
the third multiplier successively receives the fifth and seventh tapped signals and generates a weighted fifth tapped signal and a weighted seventh tapped signal as the third multiplier output signal, respectively,
the fourth multiplier successively receives the sixth and eighth tapped signals and generates a weighted sixth tapped signal and a weighted eighth tapped signal as the fourth multiplier output signal, respectively,
the second accumulator accumulates the fourth output signal, the weighted fifth tapped signal, the weighted sixth tapped signal, the weighted seventh tapped signal, and the weighted fourth tapped signal and generates the second accumulator signal, and
the twenty-sixth multiplexer outputs the second accumulator signal as the eighth output signal.

12. The FIR filter of claim 9, wherein when the cascaded unit is configured as a symmetric filter:
the third multiplexer receives the sixth output signal as the fourth input signal,
the first and second control circuits generate the first and second sets of signals, respectively, such that the fifteenth multiplexer outputs the first output signal as the fourteenth intermediate signal,
the fourth tapped delay line receives the fifth output signal as the sixteenth intermediate signal,
the second tapped delay line receives the sixth output signal as the fourth intermediate signal,
the first, second, third, and fourth multipliers receive the first, second, fifth, and sixth adder signals and generate a weighted first adder signal, a weighted second adder signal, a weighted fifth adder signal, and a weighted sixth adder signal as the first, second, third, and fourth multiplier output signals, respectively,
the third adder adds the first and second multiplier output signals and generates the third adder signal, the thirteenth multiplexer outputs the third adder signal as the fourth output signal, the seventh adder adds the fourth output signal, and the third and fourth multiplier output signals, and generates the seventh adder signal, and the twenty-sixth multiplexer outputs the seventh adder signal as the eighth output signal.

13. The FIR filter of claim 9, wherein when the cascaded unit is configured as an asymmetric filter:
the first control circuit generates the first set of signals such that:
the first and second multipliers receive the first and second tapped signals, respectively, and generate a weighted first tapped signal and a weighted second tapped signal as the first multiplier output signal and the second multiplier output signal, respectively,
the third adder adds the first and second multiplier output signals and generates the third adder signal, and
the thirteenth multiplexer outputs the third adder signal as the fourth output signal, and
the second control circuit generates the second set of signals such that:
the third tapped delay line receives the first output signal as the fourteenth intermediate signal,
the third and fourth multipliers receive the fifth and sixth tapped signals, respectively, and generate a weighted fifth tapped signal and a weighted sixth tapped signal as the third multiplier output signal and the fourth multiplier output signal, respectively,
the seventh adder adds the fourth output signal, and the third and fourth multiplier output signals and generates the seventh adder signal, and
the twenty-sixth multiplexer outputs the seventh adder signal as the eighth output signal.

14. The FIR filter of claim 9, wherein:
when the cascaded unit is configured as a complex symmetric filter:
the first control circuit generates the first set of signals such that the second tapped delay line receives the first output signal as the fourth intermediate signal,
the first and second multipliers receive the first and second adder signals, respectively, and generate a weighted first adder signal and a weighted second adder signal as the first multiplier output signal and the second multiplier output signal, respectively,
the third adder adds the first and second multiplier output signals and generates the third adder signal, and
the thirteenth multiplexer outputs the third adder signal as the fourth output signal, and
the second control circuit generates the second set of signals such that:
the third tapped delay line receives the third output signal as the fourteenth intermediate signal,
the twenty-fifth multiplexer outputs the fourth output signal as the twenty-fourth intermediate signal,
the fourth tapped delay line receives the fifth output signal as the sixteenth intermediate signal,
the third and fourth multipliers receive the fifth and sixth adder signals, respectively, and generate a weighted fifth adder signal and a weighted sixth adder signal as the third and fourth multiplier output signals, respectively,
the seventh adder adds the third and fourth multiplier output signals and generates the seventh adder signal,
the eighth adder adds the twenty-fourth intermediate signal and the seventh adder signal and generates the eighth adder signal, and
the twenty-sixth multiplexer outputs the eighth adder signal as the eighth output signal.

15. The FIR filter of claim 9, wherein:
when the cascaded unit is configured as a complex asymmetric filter, the first control circuit generates the first set of signals such that:
the first and second multipliers receive the first and second tapped signals, respectively, and generate a weighted first tapped signal and a weighted second tapped signal as the first multiplier output signal and the second multiplier output signal, respectively,
the third adder adds the first and second multiplier output signals and generates the third adder signal, and
the thirteenth multiplexer outputs the third adder signal as the fourth output signal, and
the second control circuit generates the second set of signals such that:
the third tapped delay line receives the third output signal as the fourteenth intermediate signal,
the twenty-fifth multiplexer outputs the fourth output signal as the twenty-fourth intermediate signal,
the third and fourth multipliers receive the fifth and sixth tapped signals, respectively, and generate a weighted fifth tapped signal and a weighted sixth tapped signal as the third multiplier output signal and the fourth multiplier output signal, respectively,
the seventh adder adds the third and fourth multiplier output signals and generates the seventh adder signal,
the eighth adder adds the twenty-fourth intermediate signal and the seventh adder signal and generates the eighth adder signal, and
the twenty-sixth multiplexer outputs the eighth adder signal as the eighth output signal.

16. The FIR filter of claim 9, further comprising:
a first register for storing the first through and fourth coefficient values and outputting the first through signals, respectively; and
a second register for storing the fifth through eighth coefficient values and outputting the fifth through eighth signals, respectively.

17. The FIR filter of claim 16, wherein:
the first control circuit includes a third register for storing values of the first through fourth control signals, the seventh and eighth control signals, and input and output operating frequencies of the first segment cell, and
the second control circuit includes a fourth register for storing values of the tenth through thirteenth control signals, the sixteenth and seventeenth control signals, and input and output operating frequencies of the second segment cell.

* * * * *